United States Patent
Im et al.

(10) Patent No.: US 9,666,512 B2
(45) Date of Patent: May 30, 2017

(54) SEMICONDUCTOR PACKAGE

(71) Applicant: Fairchild Korea Semiconductor Ltd., Gyeonggi-do (KR)

(72) Inventors: Seung-won Im, Gyeonggi-do (KR); O-seob Jeon, Seoul (KR); Joon-seo Son, Seoul (KR)

(73) Assignee: Fairchild Korea Semiconductor, Ltd., Bucheon-si, Geonggi-Do (KR)

( * ) Notice: Subject to any disclaimer, the term of this patent is extended or adjusted under 35 U.S.C. 154(b) by 23 days.

(21) Appl. No.: 14/709,786

(22) Filed: May 12, 2015

(65) Prior Publication Data

US 2015/0332992 A1     Nov. 19, 2015

Related U.S. Application Data

(60) Provisional application No. 61/992,389, filed on May 13, 2014.

(30) Foreign Application Priority Data

Sep. 4, 2014    (KR) ........................ 10-2014-0117959

(51) Int. Cl.
*H01L 29/66*      (2006.01)
*H01L 23/495*     (2006.01)
(Continued)

(52) U.S. Cl.
CPC .... *H01L 23/49575* (2013.01); *H01L 23/3735* (2013.01); *H01L 23/4334* (2013.01);
(Continued)

(58) Field of Classification Search
CPC . H01L 23/49; H01L 23/3735; H01L 23/4334; H01L 23/49503; H01L 23/49558;
(Continued)

(56) References Cited

U.S. PATENT DOCUMENTS 7,436,070 B2    10/2008   Uno et al.
7,635,962 B2    12/2009   Suh
(Continued)

FOREIGN PATENT DOCUMENTS

| JP | 07-130943 A | 5/1995 |
|---|---|---|
| KR | 10-2001-0004072 A | 1/2001 |
| KR | 10-2006-0045597 A | 5/2006 |

*Primary Examiner* — Matthew Gordon
(74) *Attorney, Agent, or Firm* — Kenneth E. Horton; Kirton McConkie

(57) ABSTRACT

A semiconductor package with a leadframe to mount a transistor device prevents malfunction. The semiconductor package includes a leadframe including at least one or more transistor die attach pads where a first transistor device and a second transistor device are arranged, a driver die attach pad where a driver semiconductor chip is arranged, a first driver lead electrically connected to the driver semiconductor chip, and a second driver lead arranged between the first driver lead and the at least one or more transistor die attach pads, a chip bonding wire electrically connecting the first transistor device with the driver semiconductor chip, a first transistor bonding wire electrically connecting the first driver lead with the second transistor device, and a first insulator arranged on the second driver lead to insulate the second driver lead and the first transistor bonding wire from each other.

21 Claims, 20 Drawing Sheets

(51) Int. Cl.
*H01L 23/00* (2006.01)
*H01L 25/07* (2006.01)
*H01L 25/18* (2006.01)
*H01L 25/16* (2006.01)
*H01L 23/373* (2006.01)
*H01L 23/433* (2006.01)

(52) U.S. Cl.
CPC .. *H01L 23/49503* (2013.01); *H01L 23/49558* (2013.01); *H01L 23/49562* (2013.01); *H01L 24/49* (2013.01); *H01L 25/072* (2013.01); *H01L 25/16* (2013.01); *H01L 25/18* (2013.01); *H01L 24/45* (2013.01); *H01L 2224/32245* (2013.01); *H01L 2224/45124* (2013.01); *H01L 2224/45144* (2013.01); *H01L 2224/45147* (2013.01); *H01L 2224/48095* (2013.01); *H01L 2224/48101* (2013.01); *H01L 2224/48137* (2013.01); *H01L 2224/48139* (2013.01); *H01L 2224/48247* (2013.01); *H01L 2224/49111* (2013.01); *H01L 2224/49171* (2013.01); *H01L 2224/73265* (2013.01); *H01L 2924/13055* (2013.01); *H01L 2924/13091* (2013.01); *H01L 2924/1426* (2013.01); *H01L 2924/181* (2013.01)

(58) Field of Classification Search
CPC ......... H01L 23/49562; H01L 23/49575; H01L 29/7393
USPC ...................................................... 257/139
See application file for complete search history.

(56) References Cited

U.S. PATENT DOCUMENTS

| | | |
|---|---|---|
| 7,863,756 B2 | 1/2011 | Uno et al. |
| 8,076,767 B2 | 12/2011 | Uno et al. |
| 8,482,345 B2 | 7/2013 | Uno et al. |
| 2013/0105958 A1* | 5/2013 | Fernando ............ H01L 23/4952 257/676 |

* cited by examiner

SEMICONDUCTOR PACKAGE

This application claims the benefit of Korean Application No. 10-2014-0117959, filed on Sep. 4, 2014, in the Korean Intellectual Property Office and U.S. Provisional Application No. 61/992,389, filed on May 13, 2014, the entire disclosures of which are hereby incorporated by reference.

1. FIELD OF THE INVENTION

The embodiments of the present disclosure relate to a semiconductor package, and more particularly, to a semiconductor package having a leadframe to mount transistor devices.

2. DESCRIPTION OF THE RELATED ART

A variety of inverter circuits to drive a device such as a motor, and semiconductor packages to implement these inverter circuits have been proposed.

However, conventional inverter circuits and semiconductor packages to implement the inverter circuits have shortcomings that the thermal interaction is large, the safe operation area (SOA) is narrower than standard sizes, and high dV/dt at the inverter circuit can be induced at CdV/dt to turn on the transistors.

Additional shortcoming is that it is difficult to detect three output currents of a three phase motor with accuracy and ease.

SUMMARY

A technical concept of the present disclosure aims to provide a semiconductor package with a leadframe to mount a transistor device, which can prevent malfunction.

More specifically, the technical concept of the present disclosure aims to provide a semiconductor package with a leadframe to mount a transistor device, which is capable of easily detecting three output currents with accuracy and ease, when driving a device such as three phase motor.

In order to achieve the technical objectives mentioned above, the present disclosure provides a semiconductor package.

In an embodiment of the present disclosure, a semiconductor package includes a leadframe including at least one or more transistor die attach pads where a first transistor device and a second transistor device are arranged, a driver die attach pad where a driver semiconductor chip is arranged, a first driver lead electrically connected to the driver semiconductor chip, and a second driver lead arranged between the first driver lead and the at least one or more transistor die attach pads, a chip bonding wire electrically connecting the first transistor device with the driver semiconductor chip, a first transistor bonding wire electrically connecting the first driver lead with the second transistor device, and a first insulator arranged on the second driver lead to insulate the second driver lead and the first transistor bonding wire from each other.

The leadframe may additionally include a third driver lead arranged between the first driver lead and the at least one or more transistor die attach pads, and connected to the driver die attach pad, and the third driver lead may be insulated from the first transistor bonding wire by the first insulator.

The third driver lead may be arranged between the second driver lead and the at least one of more transistor die attach pads.

The third driver lead may be arranged between the first driver lead and the second driver lead.

The second driver lead may be electrically connected to the driver semiconductor chip, and the semiconductor package may additionally include a third transistor device arranged on the at least one or more transistor die attach pads, and a second transistor bonding wire electrically connecting the second driver lead with the third transistor device.

The leadframe may additionally include a third driver lead arranged between the second driver lead and the at least one or more transistor die attach pads, and may be connected to the driver die attach pad, and the semiconductor package may additionally include a second insulator arranged on the third driver lead to insulate the third driver lead and the second transistor bonding wire from each other.

A straight line for electric connection between the third transistor device and the driver semiconductor chip may be overlapped with at least a portion of the third driver lead, and the second transistor bonding wire electrically may connect the third transistor device with the driver semiconductor chip through the second driver lead.

The first transistor device, the second transistor device and the third transistor device may be arranged in sequence along a first direction, and the driver semiconductor chip may be arranged such that a location of a center point of the driver semiconductor chip, which is located on the at least one or more transistor die attach pads in a second direction perpendicular to the first direction, based on the length in the first direction, is moved from a center point of overall length of the first transistor device, the second transistor device and the third transistor device in the first direction, and is moved by a first length to a direction where the first transistor device is located.

The chip bonding wire may connect the first transistor device with the driver semiconductor chip such that a straight line for electric connection of the first transistor device and the driver semiconductor chip is not overlapped with the second driver lead.

A straight line for electric connection between the first transistor device and the driver semiconductor chip may be overlapped with at least a portion of the second driver lead, and the semiconductor package may additionally include a third insulator arranged on the second driver lead to insulate the second driver lead and the chip bonding wire from each other.

A straight line for electric connection between the second transistor device and the driver semiconductor chip may be overlapped with at least a portion of the second driver lead, and the first transistor bonding wire electrically may connect the second transistor device with the driver semiconductor chip through the first driver lead.

The first transistor device and the second transistor device may be arranged in sequence along a first direction, and the driver semiconductor chip may be arranged such that a location of a center point of the driver semiconductor chip, which is located on the at least one or more transistor die attach pads in a second direction perpendicular to the first direction, based on the length in the first direction, is moved from a center point of overall length of the first transistor device and the second transistor device in the first direction, and is moved by a first length to a direction where the first transistor device is located.

Each of the first transistor device and the second transistor device may include an IGBT device or a MOSFET device.

The driver semiconductor chip may perform an inter-lock function.

The first driver lead and the second driver lead may be arranged at a predetermined interval, and in order to maintain the predetermined interval, a fixation is arranged on the first and second leads.

A third to sixth transistor devices may be arranged on the at least one or more transistor die attach pads, and the at least one or more transistor die attach pads may include at least one or more first die attach pads where at least one or more transistor devices of the first to sixth transistor devices are arranged, and at least one or more second die attach pads where a plurality of transistor devices of the first to sixth transistor devices are arranged together.

The second driver lead may be electrically connected to the driver die attach pad, or separated from the driver die attach pad, but electrically connected to the driver semiconductor chip via a driver bonding wire.

In one embodiment, a semiconductor package is provided, which may include a leadframe comprising at least one or more transistor die attach pads where a first transistor device and a second transistor device are arranged in sequence in a first direction, a driver die attach pad arranged on the at least one or more transistor die attach pads in a second direction perpendicular to the first direction, the driver die attach pad where a driver semiconductor chip is arranged, a first driver lead electrically connected to the driver semiconductor chip, and a second driver lead arranged between the first driver lead and the at least one or more transistor die attach pads, a chip bonding wire electrically connecting the first transistor device with the driver semiconductor chip, and a first transistor bonding wire electrically connecting the first driver lead with the second transistor device, wherein a straight line for electric connection between the second transistor device and the driver semiconductor chip is overlapped with at least a portion of the second driver lead, in which the driver semiconductor chip may be arranged such that a location of a center point of the driver semiconductor chip, which is located on the at least one or more transistor die attach pads in a second direction perpendicular to the first direction, based on the length in the first direction, is moved from a center point of overall length of the first transistor device and the second transistor device in the first direction, and is moved by a first length to a direction where the first transistor device is located.

The leadframe may additionally include a third driver lead arranged between the first driver lead and the at least one or more transistor die attach pads, and connected to the driver die attach pad, and the semiconductor package may additionally include a first insulator arranged on the third driver lead to insulate the third driver lead and the first transistor bonding wire from each other.

The second driver lead may be electrically connected to the driver semiconductor chip, and the leadframe may additionally include a third driver lead arranged between the second driver lead and the at least one or more transistor die attach pads, and connected to the driver die attach pad. The semiconductor package may additionally include a third transistor device arranged on the at least one or more transistor die attach pads, in which a straight line for electric connection between the third transistor device and the driver semiconductor chip is overlapped with at least a portion of the third driver lead, and a second transistor bonding wire electrically connecting the second driver lead with the third transistor device.

The semiconductor package of may additionally include a second insulator arranged on the second driver lead to insulate the second driver lead and the first transistor bonding wire from each other.

In one embodiment, a semiconductor package may include a leadframe comprising at least one or more transistor die attach pads where at least one or more first transistor devices, at least one or more second transistor devices, and at least one or more third transistor devices are arranged in sequence in a first direction, a driver die attach pad arranged on the at least one or more transistor die attach pads in a second direction perpendicular to the first direction, the driver die attach pad where a driver semiconductor chip is arranged, a first driver lead electrically connected to the driver semiconductor chip, a second driver lead arranged between the first driver lead and the at least one or more transistor die attach pads and electrically connected to the driver semiconductor chip, and a third driver lead arranged between the second driver lead and the at least one or more transistor die attach pads and connected to the driver die attach pad, a chip bonding wire electrically connecting the first transistor device with the driver semiconductor chip, a first transistor bonding wire electrically connecting the first driver lead with the second transistor device, wherein a straight line for electric connection between the second transistor device and the driver semiconductor chip is overlapped with at least a portion of the second driver lead, a second transistor bonding wire electrically connecting the second driver lead with the third transistor device, wherein a straight line for electric connection between the third transistor device and the driver semiconductor chip is overlapped with at least a portion of the third driver lead, in which the driver semiconductor chip may be arranged such that a location of a center point of the driver semiconductor chip, which is located on the at least one or more transistor die attach pads in a second direction perpendicular to the first direction, based on the length of the first direction, is moved from a center point of overall length of the at least one or more first transistor devices, the at least one or more second transistor devices, and the at least one or more third transistor devices in the first direction, and is moved by a first length to a direction where the first transistor device is located.

In one embodiment, a semiconductor package is provided, which may include a leadframe including a plurality of die attach pads, a driver semiconductor chip coupled with one of the plurality of die attach pads, the driver semiconductor chip having an inter-lock function, and at least three or more discrete device group coupled with the rest of the plurality of die attach pads, in which the at least three or more discrete device group may include an IGBT-diode device or a MOSFET device.

In one embodiment, a dual in-line package (DIP) or a surface mount device (SMD) semiconductor package is provided, which may include a leadframe comprising a plurality of die attach pads comprising a first die attach pad, a second die attach pad, and the rest of die attach pads, a driver semiconductor chip coupled to the first die attach pad, and a plurality of discrete devices comprising an IGBT-diode device or a MOSFET device comprising a first discrete device group coupled to the second die attach pad, and a second discrete device group individually coupled to the rest of die attach pads of the plurality of die attach pads, in which a center of the second die attach pad may not be in a proximity to a center of the semiconductor package, and the second die attach pad and the rest of die attach pads may be aligned in a row.

In one embodiment, a dual in-line package (DIP) or a surface mount device (SMD) semiconductor package is provided, which may include a leadframe comprising a plurality of die attach pads and a plurality of leads, a driver semiconductor chip coupled to the first die attach pad of the plurality of die attach pads, a plurality of discrete devices comprising an IGBT-diode device or a MOSFET device comprising a first discrete device group and a second discrete device group, a plurality of bonding wires electrically connecting the driver semiconductor chip, the plurality of discrete devices and the plurality of leads with each other, and a plurality of electric connector members connecting the driver semiconductor chip with the plurality of discrete devices, in which an upper electrode of one of the first discrete device group may be electrically connected to a lower electrode of one of the second discrete device group, and the at least one or more electric connector members connecting at least one or more gates of the plurality of discrete devices with the driver semiconductor chip, may include at least one or more of the plurality of bonding wires and at least one or more of the plurality of leads.

In a semiconductor package according to various embodiments, transistor devices among a plurality of transistor devices that are arranged in a relatively closer proximity to the driver semiconductor chip are connected directly to the driver semiconductor chip via a bonding wire, while the transistor devices that are relatively farther away are connected to the driver semiconductor chip via lead and bonding wires. Accordingly, the length of the bonding wire is minimized, and issues such as defects from deformation of bonding wire, etc. which can occur during fabrication process of the semiconductor packages can be resolved.

Further, as insulators are attached onto the leadframes, in the fabrication process of the semiconductor packages, or in the molding member formation process, to be more specific, accidental short between bonding wires and leads or deformation of leads can be prevented.

According to various embodiments, the semiconductor package uses one driver semiconductor chip to control IGBT-diode devices or MOSFET devices. Using inter-lock function, the semiconductor package can be prevented from malfunction.

Further, the semiconductor package can have enhanced reliability, as it is possible to simplify the electric paths formed inside the semiconductor package by arranging the driver semiconductor chip to a side that is in relatively higher need of electric connection paths.

BRIEF DESCRIPTION OF THE DRAWINGS

The above and/or other aspects of the present disclosure will be more apparent by describing certain exemplary embodiments of the present inventive concept with reference to the accompanying drawings, in which.

DETAILED DESCRIPTION OF EXEMPLARY EMBODIMENTS

Certain exemplary embodiments of the present disclosure will now be described in greater detail with reference to the accompanying drawings to assist in a comprehensive understanding of constitution and effects of the present disclosure. However, the present disclosure is not limited to the embodiments disclosed herein, but can be implemented in a variety of configurations with a variety of modifications.

Accordingly, it is apparent that the exemplary embodiments of the present disclosure are provided to perfect the present disclosure, and to inform those skilled in the art of the scope of the present disclosure completely.

For convenience of explanation, certain elements may be enlarged from actual size, and the respective elements may be illustrated on an exaggerated or reduced scale.

When an element is stated as being "on" or "in contact with" another element, it may be understood that the element may be contacted with, or connected to another element directly, or contacted or connected via yet another element which may be present in between.

On the contrary, when a certain element is stated as being "directly on" or "directly contacted with" another element, it may be understood that presence of any intervening element therebetween is foreclosed.

Other expressions such as "between" or "directly between" that explains relationship among elements may be interpreted likewise.

The expression of "first" or "second" may be used to explain a variety of elements, but should not be construed as limiting the elements.

The expressions may be used exclusively for the purpose of distinguishing one element from another.

For example, without departing from the scope of the present disclosure, the first element may be referred to as the second element, or likewise, the second element may be referred to as the first element.

Unless otherwise explicitly stated, a singular expression encompasses a plural expression.

The wording such as "comprise" or "have" used herein is intended to designate presence of characteristic, number, step, operation, element, component or a combination thereof, and may be interpreted as being open to addition of one or more other characteristics, numbers, steps, operations, elements, components or combination thereof.

Unless otherwise defined, the terms and expressions used herein may be interpreted in their meanings as generally known to those skilled in the art.

Hereinbelow, certain embodiments of the present disclosure will be explained in detail with reference to the accompanying drawings.

Figure 1:
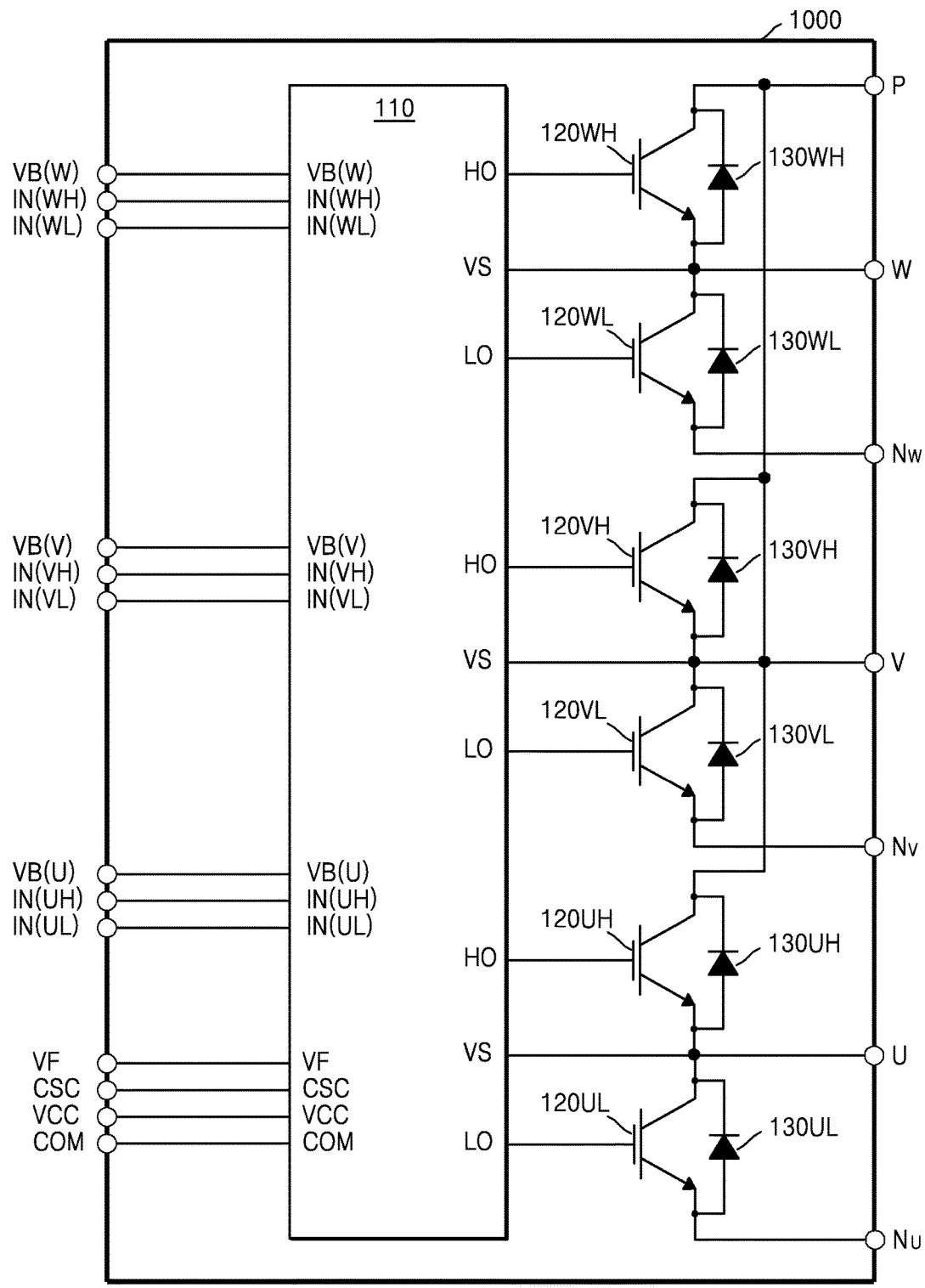
FIG. 1 is a schematic diagram of a semiconductor package according to an embodiment of the present disclosure.

The above and/or other aspects of the present disclosure will be more apparent by describing certain exemplary embodiments of the present inventive concept with reference to the accompanying drawings, in which: FIG. 1 is a schematic diagram of a semiconductor package according to an embodiment of the present disclosure;

Referring to FIG. 1, a semiconductor package 1000 includes a driver semiconductor chip 110, a plurality of transistor devices 120WH, 120WL, 120VH, 120VL, 120UH, 120UL, and a plurality of diode devices 130WH, 130WL, 130VH, 130VL, 130UH, 130UL.

For example, the semiconductor package 1000 may be configured to implement an inverter circuit to drive three-phase motor.

For example, the semiconductor package 1000 may be implemented as a dual in-line package (DIP) or a surface mount device (SMD) package.

The plurality of transistor devices 120WH, 120WL, 120VH, 120VL, 120UH, 120UL, and the plurality of diode devices 130WH, 130WL, 130VH, 130VL, 130UH, 130UL may each be discrete devices.

The plurality of transistor device 120WH, 120WL, 120VH, 120VL, 120UH, 120UL may include a W-phase upper arm transistor device 120WH, a W-phase lower arm transistor device 120WL, a V-phase upper arm transistor device 120VH, a V-phase lower arm transistor device 120VL, a U-phase upper arm transistor device 120UH and a U-phase lower arm transistor device 120UL.

The plurality of diode devices 130WH, 130WL, 130VH, 130VL, 130UH, 130UL may include a W-phase upper arm diode 130WH, a W-phase lower arm diode 130WL, a V-phase upper arm diode 130VH, a V-phase lower arm diode 130VL, a U-phase upper arm diode 130UH and a U-phase lower arm diode 130UL.

The plurality of transistor device 120WH, 120WL, 120VH, 120VL, 120UH, 120UL may be, for example, power transistor devices.

The plurality of transistor devices 120WH, 120WL, 120VH, 120VL, 120UH, 120UL may each be, for example, insulated gate bipolar transistor (IGBT) devices.

The "IGBT-diode device" as used herein may refer to one IGBT transistor device and one diode device connected in parallel with each other.

For example, the IGBT-diode device may have a diode device connected in parallel between emitter and collector of the IGBT.

For example, the W-phase upper arm transistor device 120WH and the W-phase upper arm diode 130WH may be the W-phase upper arm IGBT-diode devices, the W-phase lower arm transistor device 120WL and the W-phase lower arm diode 130WL may be the W-phase lower arm IGBT-diode device, the V-phase upper arm transistor device 120VH and the V-phase upper arm diode 130VH may be the V-phase upper arm IGBT-diode devices, the V-phase lower arm transistor device 120VL and the V-phase lower arm diode 130VL may be the V-phase lower arm IGBT-diode devices, the U-phase upper arm transistor device 120UH and the U-phase upper arm diode 130UH may be the U-phase upper arm IGBT-diode devices, and the U-phase lower arm transistor device 120UL and the U-phase lower arm diode 130UL may be the U-phase lower arm IGBT-diode devices.

The semiconductor package 1000 may be configured to implement an inverter circuit to drive a three-phase motor, but not limited thereto. Accordingly, the semiconductor package 1000 may be configured to implement an inverter circuit to drive a two-phase motor.

In an embodiment where the semiconductor package 1000 is configured to implement an inverter circuit to drive a three-phase motor, the semiconductor package 1000 may include six IGBT-diode devices including three upper arm IGBT-diode devices and three lower arm IGBT-diode devices.

The semiconductor package 1000 may include first inputs IN(WH), IN(WL) to receive input signals for the W-phase upper arm and lower arm, respectively, second inputs IN(VH), IN(VL) to receive input signals for V-phase upper arm and lower arm, respectively, and third inputs IN(UH), IN(UL) to receive input signals for U-phase upper arm and lower arm, respectively.

The semiconductor package 1000 may also include bias voltage inputs VB(W), VB(V), VB(U) for each of the W-phase, V-phase and U-phase IGBT-diode devices.

The semiconductor package 1000 may additionally include a common bias voltage input (VCC) and a common ground input (COM) for the driver semiconductor chip 110, the plurality of transistor devices 120WH, 120WL, 120VH, 120VL, 120UH, 120UL and the plurality of diode devices 130WH, 130WL, 130VH, 130VL, 130UH, 130UL, a fault signal end VF, and a capacitor input CSC for short circuit current detection.

The semiconductor package 1000 may include a first output W to provide a W-phase output signal, a second output V to provide a V-phase output signal, and a third output U to provide a U-phase output signal.

Further, the semiconductor package 1000 may include current detect terminals NW, NV, NU for W-phase, V-phase and U-phase, respectively, and a drive power terminal P.

The current detect terminals NW, NV, NU respectively for W-phase, V-phase, and U-phase and the drive power terminal P may be called the 'negative DC-link ends NW, NV, NU' respectively for W-phase, V-phase and U-phase, and the 'positive DC-link end'.

The driver semiconductor chip 110 may include inputs IN(WH), IN(WL), IN(VH), IN(VL), IN(UH), IN(UL), VB(W), VB(V), VB(U), VF, CSC, VCC, COM respectively corresponding to the first to third inputs IN(WH), IN(WL), IN(VH), IN(VL), IN(UH), IN(UL), the bias voltage inputs VB(W), VB(V), VB(U), the common bias voltage input VCC, the common ground input COM, the fault signal end VF and the capacitor input CSC of the semiconductor package 1000.

Considering that the inputs IN(WH), IN(WL), IN(VH), IN(VL), IN(UH), IN(UL), VB(W), VB(V), VB(U), VF, CSC, VCC, COM of the driver semiconductor chip 110 are electrically connected to correspond to the inputs IN(WH), IN(WL), IN(VH), IN(VL), IN(UH), IN(UL), VB(W), VB(V), VB(U), VF, CSC, VCC, COM of the semiconductor package 1000, respectively, the inputs of the driver semiconductor chip 110 and the semiconductor package may be altogether referred to as the inputs 1000IN(WH), IN(WL), IN(VH), IN(VL), IN(UH), IN(UL), VB(W), VB(V), VB(U), VF, CSC, VCC, COM, without specifically distinguishing the inputs of the driver semiconductor chip 110 from the inputs of the semiconductor package 1000 or vice versa.

The driver semiconductor chip 110 may include three upper arm outputs HO, lower arm outputs LO, and three sense outputs VS, respectively.

The three upper arm outputs HO may output upper arm drive signals, respectively, and the three lower arm outputs LO may output lower arm drive signals, respectively.

The three upper arm outputs HO may be connected to gates of the W-phase upper arm transistor device 120WH, the V-phase upper arm transistor device 120VH and the U-phase upper arm transistor device 120UH respectively, to provide a W-phase upper arm drive signal, a V-phase upper arm drive signal and a U-phase upper arm drive signal.

The three lower arm outputs LO are connected to gates of the W-phase lower arm transistor device 120WL, the V-phase lower arm transistor device 120VL and the U-phase lower arm transistor device 120UL respectively, to provide a W-phase lower arm drive signal, a V-phase lower arm drive signal and a U-phase lower arm drive signal.

The three sense outputs VS may be connected to emitters or sense terminals of the W-phase upper arm transistor device 120WH, the V-phase upper arm transistor device 120VH and the U-phase upper arm transistor device 120UH, respectively.

The collectors of the W-phase upper arm transistor device 120WH, the V-phase upper arm transistor device 120VH and the U-phase upper arm transistor device 120UH may be connected together to the drive power terminal P of the semiconductor package 1000.

The emitter of the W-phase upper arm transistor device 120WH and the collector of the W-phase lower arm transistor device 120WL may be connected together to the first output W of the semiconductor package 1000.

The emitter of the V-phase upper arm transistor device 120VH and the collector of the V-phase lower arm transistor device 120VL may be connected together to the second output V of the semiconductor package 1000.

The emitter of the U-phase upper arm transistor device 120UH and the collector of the U-phase lower arm transistor device 120UL may be connected together to the third output U of the semiconductor package 1000.

The emitters of the W-phase lower arm transistor device 120WL, the V-phase lower arm transistor device 120VL and the U-phase lower arm transistor device 120UL may be connected to the current detect terminals NW, NY, NU for W-phase, V-phase and U-phase of the semiconductor package 1000.

As the semiconductor package 1000 has one driver semiconductor chip 110, the semiconductor package 1000 may have one fault signal end VF and one capacitor input CSC, along with the common bias voltage input VCC and the common ground input COM.

The driver semiconductor chip 110 may perform an inter-lock function.

The inter-lock function herein refers to controlling a corresponding device not to operate when a set condition is electrically not met.

That is, the driver semiconductor chip 110, as it performs the inter-lock function, may not allow another operation to start until the operation in progress is finished.

For example, when the first upper input IN(WH) to receive an input signal for W-phase upper arm is HIGH, and when the first lower input IN(WL) to receive an input signal for W-phase lower arm is HIGH, the upper arm output HO for the W-phase may be maintained HIGH, and the lower arm output LO may be LOW.

When the first lower input IN(WL) is HIGH, and when the first upper input IN(WH) to receive an input signal for the W-phase lower arm is HIGH, the lower arm output LO for the W-phase may be maintained HIGH, and the upper arm output HO may be LOW.

Further, when both the first upper input IN(WH) and the first lower input IN(WL) are concurrently HIGH, the upper arm outputs HO for the W-phase may be maintained HIGH, and the lower arm output LO may be LOW.

Further, the same inter-lock function may equally apply to the second inputs IN(VH), IN(VL) and the third inputs IN(UH), IN(VH), and this will not be redundantly explained for the sake of brevity.

Figure 2:
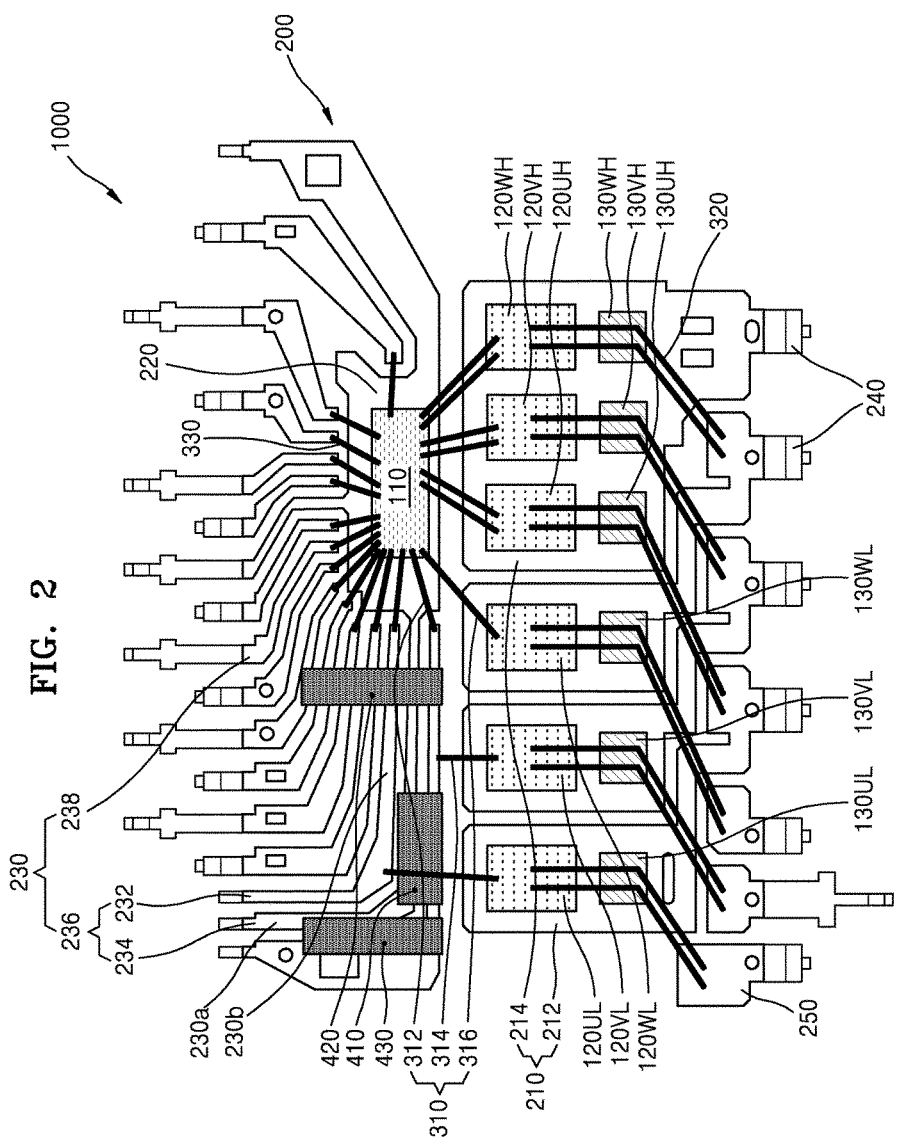
FIG. 2 is a plan view illustrating a main portion of a semiconductor package according to an embodiment of the present disclosure.

FIG. 2 is a plan view illustrating a main portion of a semiconductor package according to an embodiment;

Referring to FIG. 2, the semiconductor package 1000 may include a leadframe 200 and a driver semiconductor chip 110, a plurality of transistor devices 120WH, 120WL, 120VH, 120VL, 120UH, 120UL and a plurality of diode devices 130WH, 130WL, 130VH, 130VL, 130UH, 130UL, attached to the leadframe 200.

The leadframe 200 may be formed of silver, copper or silver and copper, for example.

The leadframe 200 may include at least one or more transistor die attach pads 210 and a single number of driver die attach pad 220.

The transistor die attach pads 210 may include a plurality of first die attach pads 212 and/or a single number of second die attach pad 214.

Each of the plurality of first die attach pads 212 and the single number of second die attach pad 214 constituting the transistor die attach pads 210 may be aligned in a row.

For example, each of the plurality of first die attach pads 212 and the single number of second die attach pad 214 may be arranged in sequence along a first direction (i.e., horizontal direction in FIG. 2).

The driver die attach pad 220 may be arranged in proximity to the transistor die attach pads 210, but at a distance apart from the transistor die attach pads 210.

The driver die attach pad 220 may be arranged at a distance apart from a row in the first direction (i.e., horizontal direction in FIG. 2) of each of the plurality of first die attach pads 212 and the single number of second die attach pad 214 constituting the transistor die attach pad 210, in a second direction which is different from the first direction.

The driver die attach pad 220 may be arranged such that the center thereof is closer to the single number of second die attach pad 214 than to the plurality of first die attach pads 212.

That is, the driver die attach pad 220 may be arranged so that the center thereof is closer to the center of the single number of second die attach pad 214 than to the center of the entire plurality of the first die attach pads 212.

Or conversely, the driver die attach pad 220 may be arranged such that the center thereof is closer to the plurality of first die attach pads 212 than to the single number of second die attach pads 214.

To be specific, the driver die attach pad 220 may be arranged so that the center thereof is closer to the center of the entire plurality of the first die attach pads 212 than to the center of the single number of second die attach pad 214.

That is, the driver die attach pad 220 may be arranged so that the center thereof is deviated to a side, rather than being in a proximity to the center of the semiconductor package 1000.

To be specific, the driver die attach pad 220 may be arranged so that the center thereof in the first direction is not in the proximity to the center of the first direction of the semiconductor package 1000, but is deviated along the first direction from the center of the first direction to a side.

As used herein, the driver die attach pad 220, the second die attach pad 214, and the first die attach pads 212 may be referred to as the first die attach pad, the second die attach pads and remaining die attach pads, respectively, for convenience of explanation.

On the transistor die attach pad 210, the plurality of transistor devices 120WH, 120WL, 120VH, 120VL, 120UH, 120UL may be arranged along the first direction.

On each of the plurality of first die attach pads 212, a single number of the transistor devices 120WL, 120VL, 120UL may be attached and coupled, and on the single number of second die attach pad 214, a plurality of transistor devices 120WH, 120VH, 120UH may together be attached and connected.

On the driver die attach pad 220, the driver semiconductor chip 110 may be attached and connected.

On each of the plurality of first die attach pads 212, a single number of each of the diode devices 130WL, 130VL, 130UL may be additionally attached and connected, and on the single number of second die attach pad 214, a plurality of diode devices 130WH, 130VH, 130UH may be additionally attached and connected.

In the present disclosure, the driver semiconductor chip 110, the plurality of transistor devices 120WH, 120WL, 120VH, 120VL, 120UH, 120UL, and the plurality of diode devices 130WH, 130WL, 130VH, 130VL, 130UH, 130UL may all be semiconductor chips which are separated after the process of semiconductor wafer forming and dicing.

Note that the plurality of transistor devices 120WH, 120WL, 120VH, 120VL, 120UH, 120UL, and the plurality of diode devices 130WH, 130WL, 130VH, 130VL, 130UH, 130UL may be discrete devices formed from separate semiconductor chips, respectively, and the driver semiconductor chip 110 may be an integrated circuit (IC). Accordingly, these are distinctively referred to as the transistor "device", the diode "device" and the driver "semiconductor chip".

The plurality of transistor devices 120WH, 120WL, 120VH, 120VL, 120UH, 120UL may each be, for example, insulated gate bipolar transistor (IGBT) devices.

The plurality of transistor devices 120WH, 120WL, 120VH, 120VL, 120UH, 120UL may each have pads for at least one or more upper electrodes and pads for lower electrode.

For example, the at least one or more upper electrode of each of the plurality of transistor devices 120WH, 120WL, 120VH, 120VL, 120UH, 120UL may be gate electrodes and emitter electrodes, and the lower electrode may be a collector electrode.

For example, all the lower surfaces of the plurality of transistor devices 120WH, 120WL, 120VH, 120VL, 120UH, 120UL may be the collector electrodes which are lower electrodes, respectively, and at least one or more pads for the at least one or more upper electrodes may be formed on the upper surfaces.

The driver semiconductor chip 110 and/or the plurality of diode devices 130WH, 130WL, 130VH, 130VL, 130UH, 130UL may have pads for a plurality of electrodes on the upper surfaces.

For example, the pads for the input and the output of the driver semiconductor chip 110 explained above with reference to FIG. 1 may be formed on the upper surface of the driver semiconductor chip 110 explained above with reference to FIG. 1.

For example, the pads for both ends may be formed on the upper surfaces of the diode devices 130WH, 130WL, 130VH, 130VL, 130UH, 130UL.

A first individual device group may be coupled to the single number of second die attach pad 214.

The first individual device group may include a plurality of upper arm transistor devices 120WH, 120VH, 120UH.

A second individual device group may be coupled to the plurality of first die attach pads 212.

The second individual device group may include a plurality of lower arm transistor devices 120WL, 120VL, 120UL.

The number of the plurality of first die attach pads 212 may be same as the number of the transistor devices attached to the single number of second die attach pad 214, i.e., as the number of the plurality of upper arm transistor devices 120WH, 120VH, 120UH.

For example, the number of the plurality of first die attach pads 212 and the number of the upper arm transistor devices 120WH, 120VH, 120UH attached to the second die attach pad 214 may be 3, respectively.

The first individual device group may additionally include a plurality of diode devices 130WH, 130VH, 130UH connected to the plurality of upper arm transistor devices 120WH, 120VH, 120UH, respectively.

The second individual device group may additionally include a plurality of diode devices 130WL, 130VL, 130UL connected to the plurality of lower arm transistor devices 120WL, 120VL, 120UL, respectively.

That is, the plurality of individual devices including the first individual device group coupled to the second die attach pad 214 and the second individual device group coupled to the plurality of first die attach pads 212 may include IGBT-diode devices.

That is, the first individual device group may be the individual devices for the upper arms, and the second individual device group may be the individual devices for the lower arms.

The leadframe 200 may additionally include a driver lead 230, a first transistor lead 240 and a second transistor lead 250.

The driver lead 230 may extend from around the driver die attach pad 220, but may be separated apart from the transistor die attach pad 210.

There may be a plurality of first transistor leads 240 extended from each of the plurality of first die attach pads 212 and the single number of second die attach pad 214.

There may be a plurality of second transistor leads 250 separated from the transistor die attach pad 210.

The first and second transistor leads 240, 250 may be arranged in a direction different from the direction where the driver die attach pad 220 is arranged, with reference to the plurality of first die attach pads 212 and the single number of second die attach pad 214.

The driver lead 230 may function as an input of the semiconductor package 1000 or it may be a dummy lead.

The first transistor lead 240 and the second transistor lead 250 may function as the outputs of the semiconductor package 1000.

The plurality of driver leads 230 may include a first extension lead 236 including a first extension 232 extended along the first direction in which the plurality of first die attach pads 212 are aligned, and a second extension 234 extended in a direction different from the first direction, and a second extension lead 238 extended from around the driver die attach pad 220 to a direction different from the first direction.

There may be one, or a plurality of first extension leads 236 in the proximity to the plurality of first die attach pads 212 among the plurality of driver leads 230.

If the center of the driver die attach pad 220 is arranged closer to the plurality of first die attach pads 212 than to the single number of second die attach pad 214, there may be one, or a plurality of first extension leads 236 in the proximity to the second die attach pad 214 among the plurality of driver leads 230.

The first extension 232, which may be extended parallel to the first direction, may also be extended at a slight angle with respect to the first direction, or may be extended parallel to the first direction and then further extended at a slight angle with respect to the first direction, although all the examples above may generally be interpreted as referring to extending along the first direction.

The plurality of driver leads 230 may consist of a connection lead 230a electrically connected to the driver die attach pad 220, and a separation lead 230b separated from the driver die attach pad 220.

That is, the plurality of driver leads 230 may include the connection leads 230a and the rest (i.e., separation leads 230b).

The first extension lead 236 may be the connection lead 230a or the separation lead 230b.

When there are a plurality of first extension leads 236, at least one of the first extension leads 236 may be the connection lead 230a, while the rest may be the separation leads 230b.

As illustrated in FIG. 2, the connection lead 230a may be integrally formed with the driver die attach pad 220, but not limited thereto. For example, the connection lead 230a may be separated from the driver die attach pad 220, while being in electric connection with the driver die attach pad 220 through a conductive connector member.

That is, the plurality of driver leads 230 may be identified as the connection leads 230a or the separation leads 230b depending on whether the driver leads 230 are electrically connected to the driver die attach pad 220 or electrically separated from the driver die attach pad 220. Besides, for convenience of explanation, among the plurality of driver leads 230, the driver lead 230 that includes the first extension 232 extended along the first direction will be referred to as the first extension lead 236 herein.

There may be one, or a plurality of first extension leads 236 in proximity to the plurality of first die attach pads 212 among the driver leads 230.

An insulator 410 may be attached onto the first extension lead 236 to cover a portion of the first extension 232.

The insulator 410 may cover portion of the first extension 232 of one first extension lead 236, or cover portions of each of the first extensions 232 of two or more first extension leads 236 together.

As illustrated in FIG. 2, the insulator 410 may be attached across the two of the first extension leads 236, but not limited thereto. Accordingly, the insulator 410 may be separately attached to the two of the first extension leads 236, respectively.

The insulator 410 may be formed as an insulating tape with an adhesive layer formed thereon, and may be attached to a portion of the first extension 232 through the adhesive layer.

In the above example, one, or two or more of the first extension leads 236 may be in the closest proximity to the plurality of first die attach pads 212 among driver leads 236 covered by the insulator 410.

That is, the insulator 410 may cover a portion of the one extension lead 236 in the closest proximity to the plurality of first die attach pads 212, or may cover portions of two or more of first extension leads 236 in the closest proximity to the plurality of first die attach pads 212 together.

When the insulator 410 covers portions of each of the first extensions 232 of the two or more first extension leads 236, at least one of the two or more first extension leads 236 covered by the insulator 410 may be the connection lead 230a.

The insulator 410 may insulate the first extension lead 236 where the insulator 410 is arranged, from an inner bonding wire 310 (to be explained) in order to prevent the inner bonding wire 310 from being accidentally shorted with any of the first extension leads 236.

A first fixation 420 may be additionally attached onto the driver leads 230 to cover portions of the two or more driver leads 230 together.

The first fixation 420 may include, for example, an insulating tape having an adhesive layer formed thereon, which may be attached to the portions of the two or more driver leads 230 through the adhesive layer.

The first fixation 420 may be extended along a direction (e.g., the second direction) different from the first direction, to cover portions of the first extensions 232 of each of the two or more first extension leads 236 together.

The first fixation 420 can maintain gaps between the first extension leads 236 in which the first extensions 232 have relatively increased length of extension due to the driver die attach pad 220 being arranged to be deviated to the side.

A second fixation 430 to cover portions of the two or more driver leads 230 together may additionally be attached onto the driver lead 230.

The second fixation 430 may include, for example, an insulating tape having an adhesive layer formed thereon and may be attached together onto the portions of the two or more driver leads 230 through the adhesive layer.

The second fixation 430 may be extended along a direction (e.g., the second direction) different from the first direction, to cover portions of the second extensions 234 of each of the two or more first extension leads 236 together.

The second fixation 430 can maintain gaps between the first extension leads 236 in which the second extensions 234 have relatively increased length of extension.

The semiconductor package 1000 may include bonding wires 310, 320, 330.

The bonding wires 310, 320, 330 may include an internal bonding wire 310, an output bonding wire 320 and an input bonding wire 330.

The internal bonding wire 310 may electrically connect the driver semiconductor chip 110 to the plurality of transistor devices 120WH, 120WL, 120VH, 120VL, 120UH, 120UL, respectively.

The output bonding wire 320 may electrically connect the plurality of transistor devices 120WH, 120WL, 120VH, 120VL, 120UH, 120UL with the plurality of diode devices 130WH, 130WL, 130VH, 130VL, 130UH, 130UL, respectively.

The input bonding wire 330 may electrically connect the driver semiconductor chip 110 and the driver lead 230 which functions as an input of the semiconductor package 1000.

The internal bonding wire 310, the output bonding wire 320 and the input bonding wire 330 may include gold (Au).

Further, the internal bonding wire 310, the output bonding wire 320 and the input bonding wire 330 may include at least one of metals including gold, copper and aluminum.

The internal bonding wire 310, the output bonding wire 320 and the input bonding wire 330 may each be formed from a same material, or different materials.

For example, the internal bonding wire 310 and the input bonding wires 310, 330 may be formed from the same material, while the output bonding wire 320 is formed from a different material.

The internal bonding wire 310 may include a driver bonding wire 312, a transistor bonding wire 314 and a chip bonding wire 316.

The driver bonding wire 312 may connect the driver semiconductor chip 110 and the separation lead 230*b*.

The transistor bonding wire 314 may connect the separation lead 230*b* to at least one of the transistor devices 120WH, 120WL, 120VH, 120VL, 120UH, 120UL.

The chip bonding wire 316 may connect at least one of the transistor devices 120WH, 120WL, 120VH, 120VL, 120UH, 120UL to the driver semiconductor chip 110.

That is, some of the transistor devices 120WH, 120WL, 120VH, 120VL, 120UH, 120UL may be electrically connected to the driver semiconductor chip 110 via the driver bonding wire 312, the separation lead 230*b* and the transistor bonding wire 314, while the rest may be electrically connected to the driver semiconductor chip 110 via the chip bonding wire 316.

That is, some of the internal bonding wire 310 and the separation lead 230*b* may function as the electric connector member which connect the driver semiconductor chip 110 and transistor devices 120WH, 120WL, 120VH, 120VL, 120UH, 120UL.

The upper arm transistor devices 120WH, 120VH, 120UH may be electrically connected to the upper arm output HO and the sense output VS of the driver semiconductor chip 110 via two routes formed by the respective internal bonding wires 310.

The lower arm transistor devices 120WL, 120VL, 120UL may be electrically connected to the lower arm output LO of the driver semiconductor chip 110 via one route formed by the respective internal bonding wires 310.

The internal bonding wire 310 may electrically connect the upper and lower arm outputs HO, LO of the driver semiconductor chip 100 to the gates of the plurality of transistor devices 120WH, 120WL, 120VH, 120VL, 120UH, 120UL, respectively.

Some of each of the upper and lower arm outputs HO, LO of the driver semiconductor chip 100 and the gates of each of the plurality of transistor devices 120WH, 120WL, 120VH, 120VL, 120UH, 120UL may be connected via the driver bonding wire 312, the separation lead 230*b* and the transistor bonding wire 314, while the rest may be connected via the chip bonding wire 316.

As illustrated in FIG. 2, the two transistor devices 120VL, 120UL may be connected to the driver semiconductor chip 110 via the transistor bonding wire 314, the separation lead 230*b* and the driver bonding wire 312, while the rest of the transistor devices 120WL, 120WH, 120VH, 120UH are connected to the driver semiconductor chip 110 via the chip bonding wire 316, but not limited thereto.

For example, when the size of the driver semiconductor chip 110 or to be more specific, when the width in the first direction is larger, only one transistor device (e.g., 120UL) may be connected to the driver semiconductor chip 110 via the transistor bonding wire 314, the separation lead 230*b* and the driver bonding wire 312, while the rest of transistor devices 120WL, 120VL, 120WH, 120VH, 120UH may be connected to the driver semiconductor chip 110 via the chip bonding wire 316.

For example, on the contrary, when the size of the driver semiconductor chip 110 or to be more specific, when the width in the first direction is smaller, one (e.g., 120Wh) to three transistor devices (e.g., 120WH, 120VH, 120UH) may be connected to the driver semiconductor chip 110 via the chip bonding wire 316.

Among the transistor devices 120WH, 120WL, 120VH, 120VL, 120UH, 120UL, the distance from the driver semiconductor chip 110 to each of the transistor devices 120VL, 120UL connected to the driver semiconductor chip 110 via the transistor bonding wire 314, the separation lead 230*b* and the driver bonding wire 312 may be longer than the distance from the driver semiconductor chip 110 to each of the transistor devices 120WL, 120WH, 120VH, 120UH connected to the driver semiconductor chip 110 via the chip bonding wire 316.

Among the transistor devices 120WH, 120WL, 120VH, 120VL, 120UH, 120UL, those that are relatively closer to the driver semiconductor chip 110 may be electrically connected directly to the driver semiconductor chip 110 via the chip bonding wire 316, while those that are relatively farther away from the driver semiconductor chip 110 may be electrically connected to the driver semiconductor chip 110 via the separation lead 230*b*.

The separation lead 230*b* connected to the transistor bonding wire 314 may be the first extension lead 236.

When the first extension lead 236 connected to the transistor bonding wire 314 is not in the closest proximity to the first die attach pad 212 than the other first extension leads 236, the transistor bonding wire 314 may be passed through the insulator 410 phase and connect one of the transistor devices 120WH, 120WL, 120VH, 120VL, 120UH, 120UL and the separation lead 230*b*.

Accordingly, the insulator 410 may insulate between the transistor bonding wire 314 and the first extension lead 236 covered by the insulator 410 in order to prevent the transistor bonding wire 314 from being electrically shorted with the first extension lead 236 covered by the insulator 410.

As illustrated in FIG. 2, the three first extension leads 236 in the proximity to the first die attach pads 212 may be arranged such that one connection lead 230*a* is disposed between two separation leads 230*b*, but not limited thereto.

As illustrated in FIG. 2, when the three first extension leads 236 in the proximity to the first die attach pad 212 are arranged such that one extension lead 230*a* is disposed between two separation leads 230*b*, one of the transistor bonding wires 314 connects the separation lead 230*b*, which is the first extension lead 236 that is not in the closest proximity to the first die attach pad 212, to one transistor device 120VL through the insulator 410 phase. Accordingly, electric short with the other first extension lead 236 disposed between the connected separation lead 230*b* and first die attach pad 212 can be prevented.

The output bonding wire 320 electrically connects each of the plurality of transistor devices 120WH, 120WL, 120VH, 120VL, 120UH, 120UL to each of the plurality of diode devices 130WH, 130WL, 130VH, 130VL, 130UH, 130UL, and the plurality of transistor devices 120WH, 120WL, 120VH, 120VL, 120UH, 120UL and the plurality of diode devices 130WH, 130WL, 130VH, 130VL, 130UH, 130UL may be electrically connected together to any one of the first and second transistor leads 240, 250.

For example, some of the output bonding wires 320 may be electrically connected to the upper arm transistor devices 120WH, 120VH, 120UH, the diode devices 130WH, 130VH, 130UH, and the first transistor lead 240, together.

The first transistor lead 240 electrically connected to the upper arm transistor devices 120WH, 120VH, 120UH is extended from the first die attach pad 212, and thus, each of the upper arm transistor devices 120WH, 120VH, 120UH may be electrically connected to the other one of the first die attach pads 212.

The rest of the output bonding wires 320 may be electrically connected to the lower arm transistor devices 120WL, 120VL, 120UL, the diode devices 130WL, 130VL, 130UL, and the second transistor lead 250, together.

Accordingly, at least one upper electrode of each of the upper arm transistor devices 120WH, 120VH, 120UH may be electrically connected to the lower electrode of each of the lower arm transistor devices 120WL, 120VL, 120UL, via the output bonding wire 320.

Problems such as defects generated due to deformation of the internal bonding wire 310 in the fabrication process of the semiconductor package 1000 can thus be resolved, because the transistor devices among the plurality of transistor devices 120WH, 120WL, 120VH, 120VL, 120UH, 120UL that are arranged relatively closer to the driver semiconductor chip 110 are connected to the driver semiconductor chip 110 via the chip bonding wire 316, while those that are relatively farther are connected to the driver semiconductor chip 110 via the separation leads 230b, thus minimizing the length of the internal bonding wire 310.

Further, the insulator 410 can prevent the internal bonding wire 310 from being accidentally shorted with the driver lead 230 in the fabrication process (or formation of molding member, in particular) of the semiconductor package 1000.

Among the plurality of transistor devices 120WH, 120WL, 120VH, 120VL, 120UH, 120UL, the transistor devices that do not have an overlap between the straight lines for electric connection to the driver semiconductor chip 110 and the driver lead 230 may be electrically connected to the driver semiconductor chip 110 by the chip bonding wire 316.

For example, the straight lines for electric connection between the upper arm transistor devices 120WH, 120VH, 120UH and the W-phase lower arm transistor device 120WL do not overlap with the driver lead 230, and the chip bonding wire 316 may connect the upper arm transistor devices 120WH, 120VH, 120UH and the W-phase lower arm transistor device 120WL to the driver semiconductor, respectively.

The straight lines for electric connection between the transistor devices and the driver semiconductor chip as used herein refer to imaginary lines that connect the pads formed on the respective upper surfaces to electrically connect the transistor devices and the driver semiconductor chip.

The chip bonding wire 316 may be formed so as to be extended along the straight lines for the electric connection between the transistor devices and the driver semiconductor chip.

Among the plurality of transistor devices 120WH, 120WL, 120VH, 120VL, 120UH, 120UL, the transistor devices that have an overlap between the straight lines for electric connection to the driver semiconductor chip 110 on one hand, and a portion of the driver lead 230 not intended for electric connection on the other hand, may be electrically connected to the driver semiconductor chip 110 by the transistor bonding wire 314, the separation lead 230b and the driver bonding wire 312.

For example, the U-phase and V-phase lower arm transistor devices 120UL, 120VL have an overlap between the straight lines for electric connection to the driver semiconductor chip 110 on one hand, and a portion of the driver lead 230 not intended for electric connection on the other hand, and each of the U-phase and V-phase lower arm transistor devices 120UL, 120VL may be electrically connected to the driver semiconductor chip 110 by the transistor bonding wire 314, the separation lead 230b and the driver bonding wire 312.

The location of the center point based on the length of the first direction (i.e., horizontal direction in FIG. 2) of the driver semiconductor chip 110 may not be at a location of the center point of the overall length of the first direction. Rather, the location of the center point may be moved to the first direction, that is, to a direction of the W-phase upper arm transistor device 120WH, or to a direction opposite to the direction of the U-phase lower arm transistor device 120UL, by a first length.

That is, the semiconductor package 1000 may be arranged so that the driver semiconductor chip 110 is deviated to a side along the first direction by the first length, e.g., to the direction of the second die attach pad 214.

The 'first length' as used herein refers to a length with which some of the plurality of transistor devices 120WH, 120WL, 120VH, 120VL, 120UH, 120UL are connected to the driver semiconductor chip 110 via the chip bonding wire 316 that does not meet across the driver lead 230, while the rest of the plurality of transistor devices 120WH, 120WL, 120VH, 120VL, 120UH, 120UL are electrically connected to the driver semiconductor chip 110 by the transistor bonding wire 314, the separation lead 230b and the driver bonding wire 312, as the respective straight lines for electric connection to the driver semiconductor chip 110 meet across the driver lead 230 for which the electric connection is not intended.

For example, the first length may be larger than the width of the first direction of one transistor device.

Alternatively, the first length may be larger than the interval between two adjacent transistor devices.

As the driver lead 230, or the first extension lead 236 in particular may be arranged to be deviated to the direction of the transistor device (in the left-hand side of FIG. 2), the driver semiconductor chip 110 may be arranged to be deviated to a direction of the transistor device (i.e., right-hand side of FIG. 2) which is electrically connected via the chip bonding wire 316.

As the semiconductor package 1000 controls the IGBT-diode devices using one driver semiconductor chip 110, it is possible to prevent malfunction of the semiconductor package 1000 by performing inter-lock function.

Further, the semiconductor package 1000 can have enhanced reliability, as it is possible to simplify the electric paths formed inside the semiconductor package 1000 by arranging the driver semiconductor chip 110 to a side that is in relatively higher need of electric connection paths.

Figure 3:
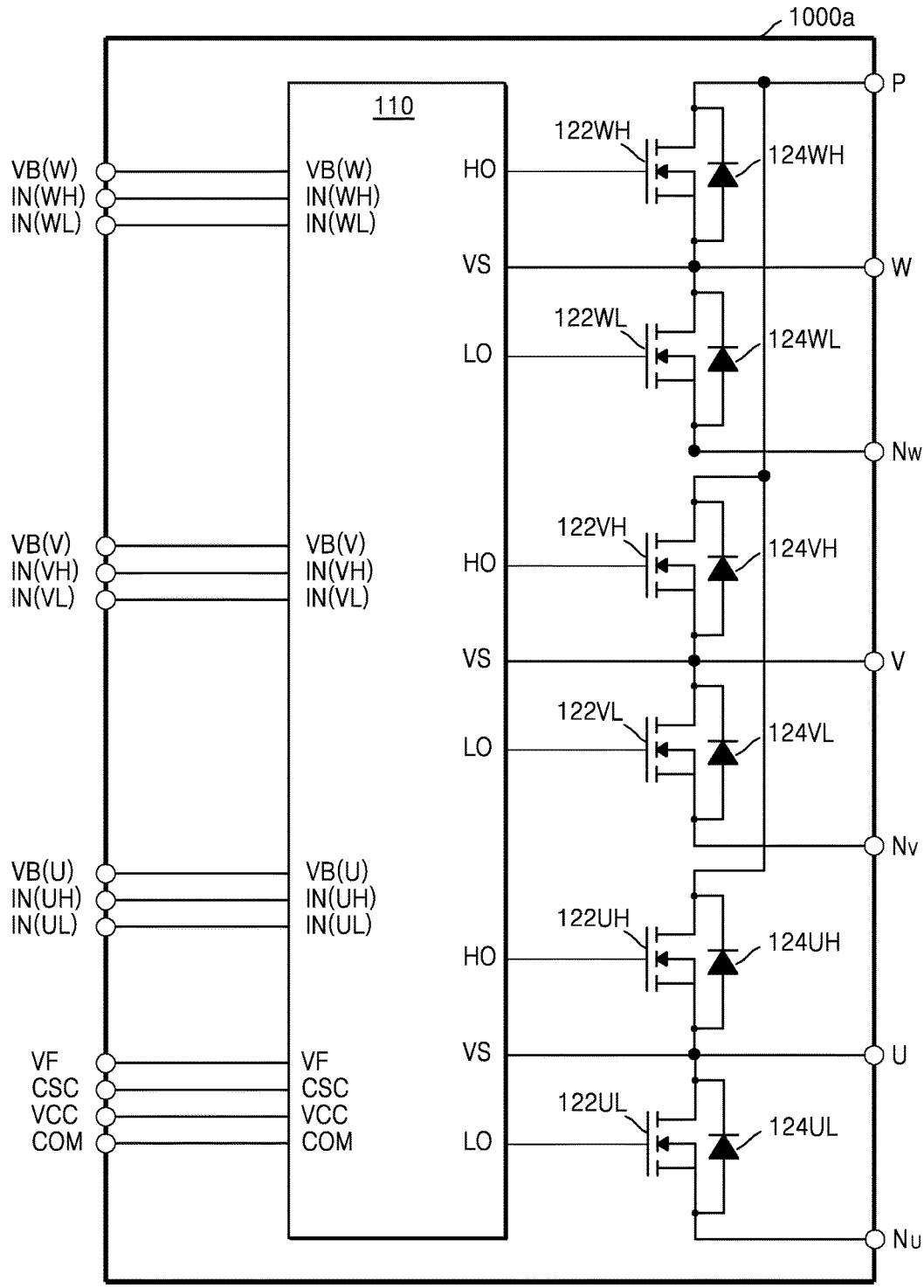
FIG. 3 is a schematic diagram of a semiconductor package according to an embodiment of the present disclosure.

FIG. 3 is a schematic diagram of a semiconductor package according to an embodiment of the present disclosure.

In describing FIG. 3, those that are redundant with the description provided above with reference to FIG. 1 may not be repeatedly explained.

Referring to FIG. 3, a semiconductor package 1000a includes a driver semiconductor chip 110 and a plurality of transistor devices 120WH, 120WL, 120VH, 120VL, 120UH, 120UL.

The semiconductor package 1000a may be configured to implement an inverter circuit to drive three-phase motor, for example.

For example, the semiconductor package 1000a may be implemented as a dual in-line package (DIP) or a surface mount device (SMD) package.

The plurality of transistor devices 122WH, 122WL, 122VH, 122VL, 122UH, 122UL may be discrete devices.

The plurality of transistor devices 122WH, 122WL, 122VH, 122VL, 122UH, 122UL may include a W-phase upper arm transistor device 122WH, a W-phase lower arm transistor device 122WL, a V-phase upper arm transistor device 120VH, a V-phase lower arm transistor device 120VL, a U-phase upper arm transistor device 122UH and a U-phase lower arm transistor device 120UL.

The plurality of transistor devices 122WH, 122WL, 122VH, 122VL, 122UH, 122UL may each be, for example, power metal oxide semiconductor field-effect transistor (MOSFET) devices.

Each of the plurality of transistor devices 122WH, 122WL, 122VH, 122VL, 122UH, 122UL may have body diodes 124WH, 124WL, 124VH, 124VL, 124UH, 124UL between sources and drains.

While the semiconductor package 1000 illustrated in FIG. 1 separately includes a plurality of diode devices 130WH, 130WL, 130VH, 130VL, 130UH, 130UL connected respectively to the plurality of transistor devices 120WH, 120WL, 120VH, 120VL, 120UH, 120UL, the semiconductor package 1000a illustrated in FIG. 3 includes a plurality of transistor devices 122WH, 122WL, 122VH, 122VL, 122UH, 122UL which are the power MOSFET devices having body diodes 124WH, 124WL, 124VH, 124VL, 124UH, 124UL therein, respectively.

Accordingly, the semiconductor package 1000a may not have separate devices (i.e., diode devices) separately, unlike the semiconductor package 1000 illustrated in FIG. 1.

In an embodiment where the semiconductor package 1000a is configured to implement an inverter circuit to drive a three-phase motor, the semiconductor package 1000a may include six MOSFET devices including three upper arm MOSFET devices and three lower arm MOSFET devices.

The inputs and outputs of the semiconductor package 1000a, and the driver semiconductor chip 110 have the identical functions as the inputs and outputs of the semiconductor package 1000 and the driver semiconductor chip 110 explained in FIG. 1, and these will not be redundantly explained for the sake of brevity.

The driver semiconductor chip 110 may include three upper arm outputs HO, lower arm outputs LO, and three sense outputs VS, respectively.

The three upper arm outputs HO may be connected to gates of the W-phase upper arm transistor device 122WH, the V-phase upper arm transistor device 122VH and the U-phase upper arm transistor device 122UH respectively, to provide a W-phase upper arm drive signal, a V-phase upper arm drive signal and a U-phase upper arm drive signal.

The three lower arm outputs LO are connected to gates of the W-phase lower arm transistor device 122WL, the V-phase lower arm transistor device 122VL and the U-phase lower arm transistor device 122UL respectively, to provide a W-phase lower arm drive signal, a V-phase lower arm drive signal and a U-phase lower arm drive signal.

The three sense outputs VS may be connected to sources or sense terminals of the W-phase upper arm transistor device 122WH, the V-phase upper arm transistor device 122VH and the U-phase upper arm transistor device 122UH, respectively.

The drains of the W-phase upper arm transistor device 122WH, the V-phase upper arm transistor device 122VH and the U-phase upper arm transistor device 122UH may be connected together to the drive power terminal P of the semiconductor package 1000a.

The source of the W-phase upper arm transistor device 122WH and the drain of the W-phase lower arm transistor device 122WL may be connected together to the first output W of the semiconductor package 1000a.

The source of the V-phase upper arm transistor device 122VH and the drain of the V-phase lower arm transistor device 122VL may be connected together to the second output V of the semiconductor package 1000a.

The source of the U-phase upper arm transistor device 122UH and the drain of the U-phase lower arm transistor device 122UL may be connected together to the third output U of the semiconductor package 1000a.

The sources of the W-phase lower arm transistor device 122WL, the V-phase lower arm transistor device 122VL and the U-phase lower arm transistor device 122UL may be connected to the current detect terminals NW, NY, NU for W-phase, V-phase and U-phase of the semiconductor package 1000a, respectively.

Figure 4:
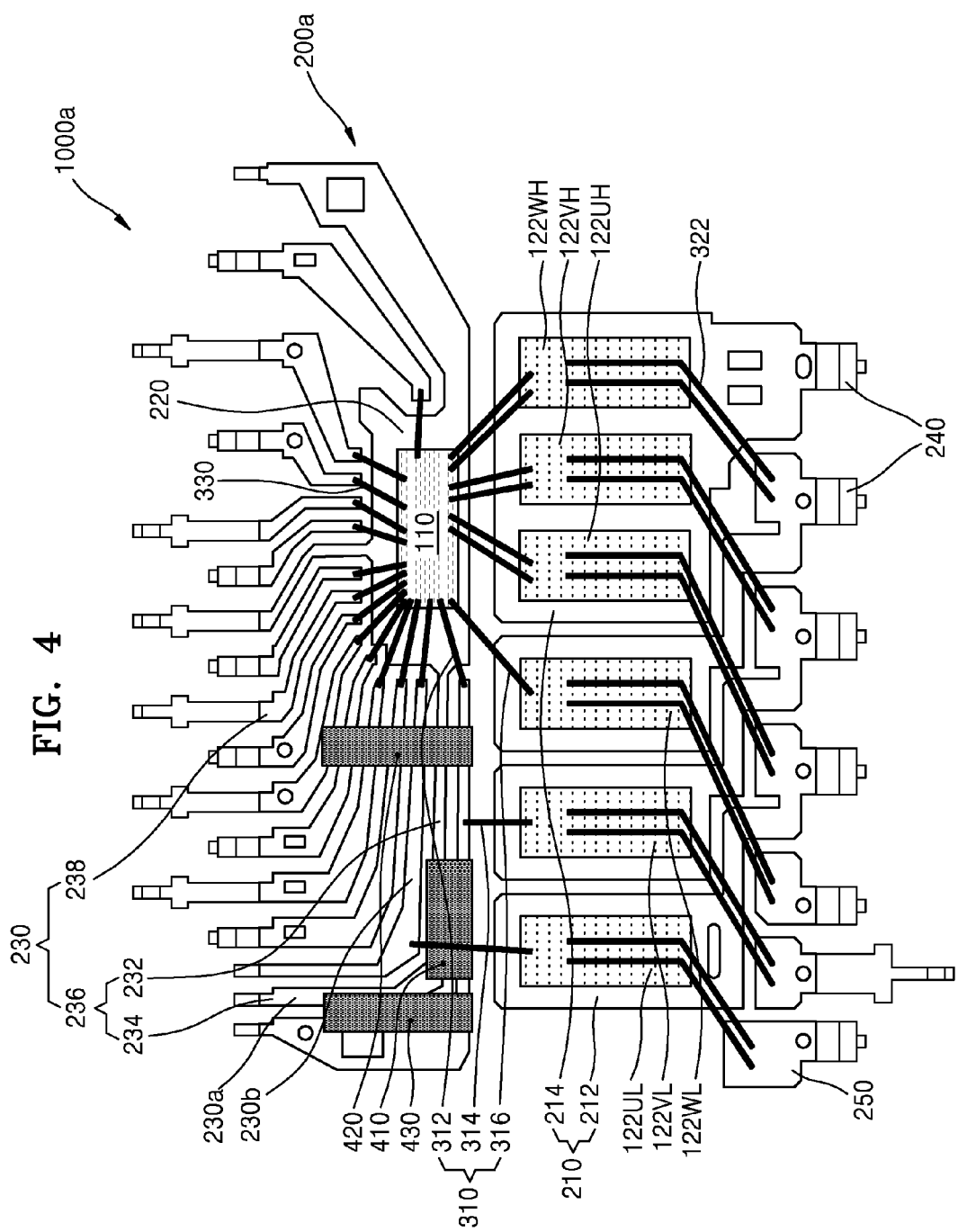
FIG. 4 is a plan view illustrating a main portion of a semiconductor package according to an embodiment of the present disclosure.

FIG. 4 is a plan view illustrating a main portion of a semiconductor package according to an embodiment of the present disclosure.

In describing FIG. 4, those that are redundant with the description provided above with reference to FIG. 2 may not be repeatedly explained.

Referring to FIG. 4, the semiconductor package 1000a includes a leadframe 200a, a driver semiconductor chip 110 and a plurality of transistor devices 122WH, 122WL, 122VH, 122VL, 122UH, 122UL, attached to the leadframe 200a.

The semiconductor package 1000a illustrated in FIG. 4 has the transistor devices 122WH, 122WL, 122VH, 122VL, 122UH, 122UL attached to and coupled with a plurality of first die attach pads 212 and a single number of second die attach pad 214, and may not be attached with separate diode devices such as those illustrated in the semiconductor package 1000 of FIG. 2.

The number of the plurality of first die attach pads 212 may be same as the number of the transistor devices attached to the single number of second die attach pad 214, i.e., as the number of the plurality of upper arm transistor devices 122WH, 122VH, 122UH.

For example, the number of the plurality of first die attach pads 212 and the number of the plurality of the upper arm transistor devices 122WH, 122VH, 1202H attached to the second die attach pad 214 may be 3, respectively.

The semiconductor package 1000a may include bonding wires 310, 322, 330.

The bonding wires 310, 322, 330 may include an internal bonding wire 310, an output bonding wire 322 and an input bonding wire 330.

The output bonding wire 322 may allow the plurality of transistor devices 122WH, 122WL, 122VH, 122VL, 122UH, 122UL to be electrically connected together to any one of the second and third transistor leads 240, 250.

For example, some of the output bonding wires 322 may electrically connect from the upper arm transistor devices 122WH, 122VH, 122UH to the first transistor lead 240.

The rest of the output bonding wires 322 may electrically connect from the lower arm transistor devices 122WL, 122VL, 122UL to the second transistor lead 250.

Accordingly, at least one upper electrode of each of the upper arm transistor devices 122WH, 122VH, 122UH may be electrically connected to the lower electrode of each of the lower arm transistor devices 122WL, 122VL, 122UL, via the output bonding wire 322.

Figure 5:
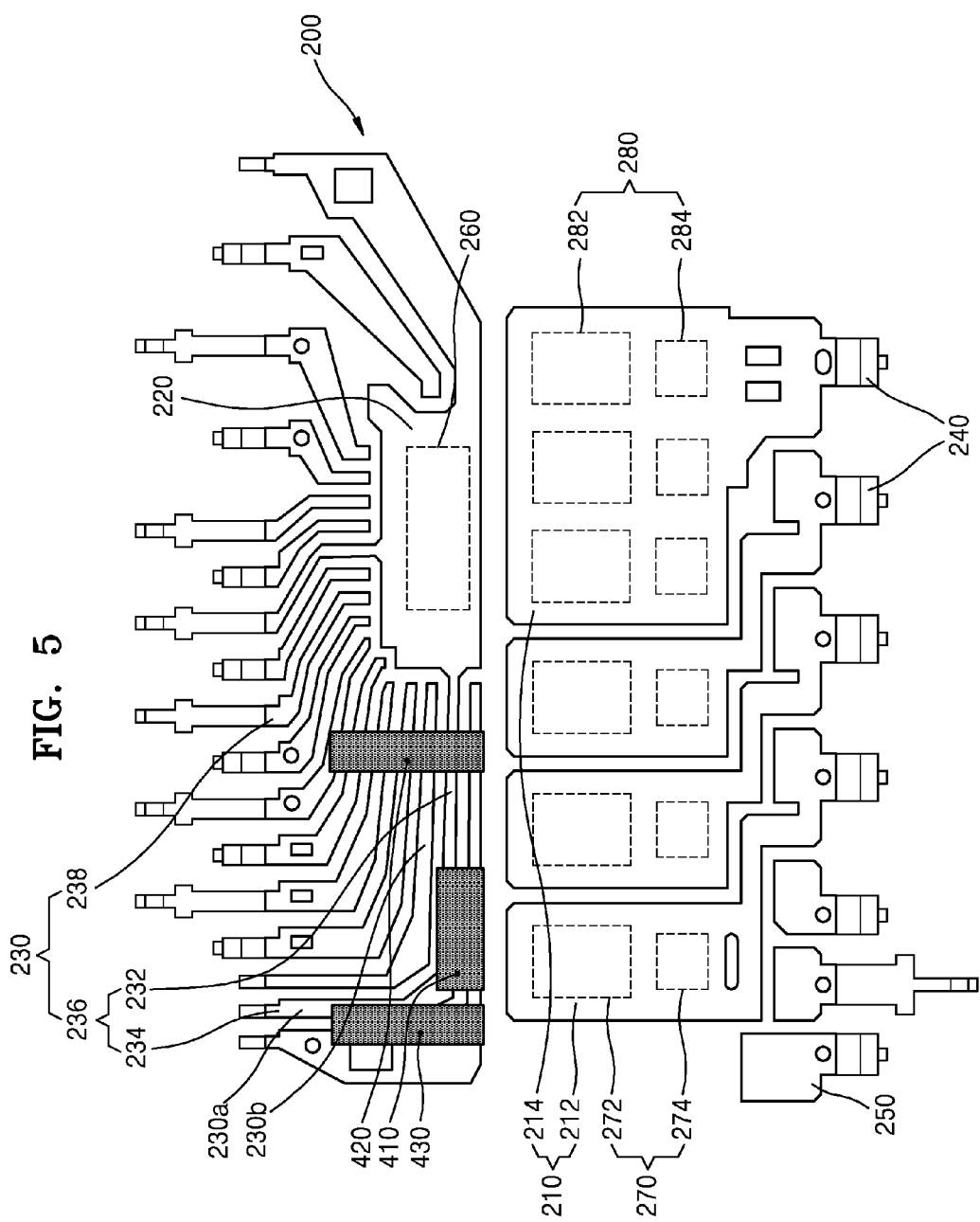
FIG. 5 is a plan view of a leadframe according to an embodiment of the present disclosure.

FIG. 5 is a plan view of a leadframe according to an embodiment of the present disclosure.

To be specific, FIG. 5 is a plan view of a leadframe 200 included in the semiconductor package 1000 illustrated in FIGS. 1 and 3.

Accordingly, those that are redundant in view of the description provided above with reference to FIGS. 1 and 3 may not be repeatedly explained below.

Referring to FIG. 5, the leadframe 200 may include a transistor die attach pad 210 including a plurality of first die attach pads 212 and a single number of second die attach pad 214, and a single number of driver die attach pad 220.

Each of the plurality of first die attach pads 212 and the single number of second die attach pad 214 constituting the transistor die attach pads 210 may be aligned in a row.

For example, each of the plurality of first die attach pads 212 and the single number of second die attach pad 214 may be arranged along a first direction (i.e., horizontal direction in FIG. 2).

The driver die attach pad 220 may be arranged in proximity to the transistor die attach pads 210, but at a distance apart from the transistor die attach pads 210.

The driver die attach pad 220 may be arranged at a distance apart from a row in the first direction (i.e., horizontal direction in FIG. 2) of each of the plurality of first die attach pads 212 and the single number of second die attach pad 214 constituting the transistor die attach pad, in a second direction which is different from the first direction.

The driver die attach pad 220 may be arranged such that the center thereof is closer to the single number of second die attach pad 214 than to the plurality of first die attach pads 212.

To be specific, the driver die attach pad 220 may be arranged so that the center thereof is closer to the center of the single number of second die attach pad 214 than to the center of the entire plurality of the first die attach pads 212.

Or conversely, the driver die attach pad 220 may be arranged such that the center thereof is closer to the plurality of first die attach pads 212 than to the single number of second die attach pads 214.

To be specific, the driver die attach pad 220 may be arranged so that the center thereof is closer to the center of the entire plurality of the first die attach pads 212 than to the center of the single number of second die attach pad 214.

That is, the driver die attach pad 220 may be arranged so that the center thereof is deviated to a side, rather than being in a proximity to the center of the leadframe 200.

To be specific, the driver die attach pad 220 may be arranged so that the center thereof in the first direction is not in the proximity to the center of the first direction of the leadframe 200, but is deviated along the first direction from the center of the first direction of the leadframe 200 to a side.

As used herein, the driver die attach pad 220, the second die attach pad 214, and the first die attach pads 212 may be referred to as the first die attach pad, the second die attach pads and remaining die attach pads, respectively, for convenience of explanation.

Each of the plurality of first die attach pads 212 may include a first device attach region 270 to which one transistor device and one diode device may be attached.

A plurality of second device attach regions 280 may be arranged on the single number of second die attach pad 214, to which one transistor device and one diode device may be attached, respectively.

On the driver die attach pad 220, the driver attach regions 260 may be arranged, to which the driver semiconductor chip may be attached.

The number of the plurality of first die attach pads 212 and the number of second device attach regions 270 may be identical.

For example, the number of the plurality of first die attach pads 212 and the number of second device attach regions 270 may be three, respectively.

On the first device attach region 274 of each of the plurality of first die attach pads 212, a first transistor attach region 272 and a first diode attach region 274 may be arranged, to which one transistor device and one diode device may be attached, respectively.

On each of the plurality of second device attach regions 280 of the single number of second die attach pad 214, a second transistor attach region 282 and a second diode attach region 284 may be arranged, to which one transistor device and one diode device may be attached, respectively.

The IGBT device may be attached to the first and second transistor attach regions 272, 282.

The number of the plurality of first die attach pads 212 may be same as the number of the transistor devices attached to the single number of second die attach pad 214.

For example, the number of the transistor devices attached to the plurality of first die attach pads 212 and the second die attach pad 214 may be three, respectively.

The leadframe 200 may additionally include a driver lead 230, a first transistor lead 240 and a second transistor lead 250.

There may be a plurality of the driver lead 230 which may extend outward from around the driver die attach pad 220, but may be separated apart from the transistor die attach pad 210.

There may be a plurality of first transistor leads 240 extended from each of the plurality of first die attach pads 212 and the single number of second die attach pad 214.

There may be a plurality of second transistor leads 250 separated from the first and second die attach pads 212, 214, and the driver die attach pad 220.

The second and second transistor leads 240, 250 may be arranged in a direction different from the direction where the driver die attach pad 220 is arranged, with reference to the plurality of first die attach pads 212 and the single number of second die attach pad 214.

The plurality of driver leads 230 may include a first extension lead 236 including a first extension 232 extended along the first direction in which the plurality of first die attach pads 212 are aligned, and a second extension 234 extended in a direction different from the first direction, and a second extension lead 238 extended from around the driver die attach pad 220 to a direction different from the first direction.

There may be one, or a plurality of first extension leads 236 in proximity to the plurality of first die attach pads 212 among the plurality of driver leads 230.

If the center of the driver die attach pad 220 is arranged closer to the plurality of first die attach pads 212 than to the single number of second die attach pad 214, there may be one, or a plurality of first extension leads 236 in the proximity to the second die attach pad 214 among the plurality of driver leads 230.

The first extension 232, which may be extended parallel to the first direction, may also be extended at a slight angle with respect to the first direction, or may be extended parallel to the first direction and then further extended at a slight angle with respect to the first direction, although all the examples above may generally be interpreted as referring to extending along the first direction.

The plurality of driver leads 230 may include a connecting lead 230*a* connected to the driver die attach pad 220, and a separation lead 230*b* separated from the driver die attach pad 220.

That is, the plurality of driver leads 230 may include the connection leads 230*a* and the rest (i.e., separation leads 230*b*).

The first extension lead 236 may be the connection lead 230*a* or the separation lead 230*b*.

When there are a plurality of first extension leads 236, at least one of the first extension leads 236 may be the connection lead 230*a*, while the rest may be the separation leads 230*b*.

That is, the plurality of driver leads 230 may be identified as the connection leads 230*a* or the separation leads 230*b* depending on whether the driver leads 230 are connected to the driver die attach pad. Besides, for convenience of explanation, among the plurality of driver leads 230, the driver lead 230 that includes the first extension 232 extended along the first direction will be referred to as the first extension lead 236 herein.

There may be one, or a plurality of first extension leads 236 in the proximity to the plurality of first die attach pads 212 among driver leads 230.

An insulator 410 may be attached onto the first extension lead 236 to cover a portion of the first extension 232.

The insulator 410 may cover a portion of the first extension 232 of one first extension lead 236, or cover portions of each of the first extensions 232 of two or more of first extension leads 236 together.

In the above example, among the first extension leads 236 covered by the insulator 410, there may be one, or two or more first extension leads 236 that are in the closest proximity to the plurality of first die attach pads 212.

That is, the insulator 410 may cover a portion of the one extension lead 236 in the closest proximity to the plurality of first die attach pads 212, or may cover portions of two or more first extension leads 236 that are in the closest proximity to the plurality of first die attach pads 212 together.

When the insulator 410 covers respective portions of the first extensions 232 of the two or more first extension leads 236, at least one of the two or more first extension leads 236 covered by the insulator 410 may be the connection lead 230*a*.

A first fixation 420 may be additionally attached onto the driver leads 230 to cover portions of the two or more driver leads 230 together.

The first fixation 420 may be extended along a direction (e.g., the second direction) different from the first direction, to cover portions of the first extensions 232 of each of the two or more first extension leads 236 in the proximity to the first die attach pad 212 together.

The first fixation 420 can maintain gaps between the first extension leads 236 in which the first extensions 232 have relatively increased length of extension due to the driver die attach pad 220 being arranged to be deviated to the side.

A second fixation 430 to cover portions of the two or more driver leads 230 together may additionally be attached onto the driver lead 230.

The second fixation 430 may be extended along a direction (e.g., the second direction) different from the first direction, to cover portions of the second extensions 234 of each of the two or more first extension leads 236 together.

The second fixation 430 can maintain gaps between the first extension leads 236 in which the second extensions 234 have relatively increased length of extension.

The insulator 410 and the first and second fixations 420, 430 may be attached onto the leadframe 200 before the transistor device, the diode device and the driver semiconductor chip are attached, but embodiments are not limited thereto. Accordingly, it is also possible that the insulator 410 and the first and second fixations 420, 430 are attached after the transistor device, the diode device and the driver semiconductor chip are attached and before the bonding wire is formed.

Figure 6:
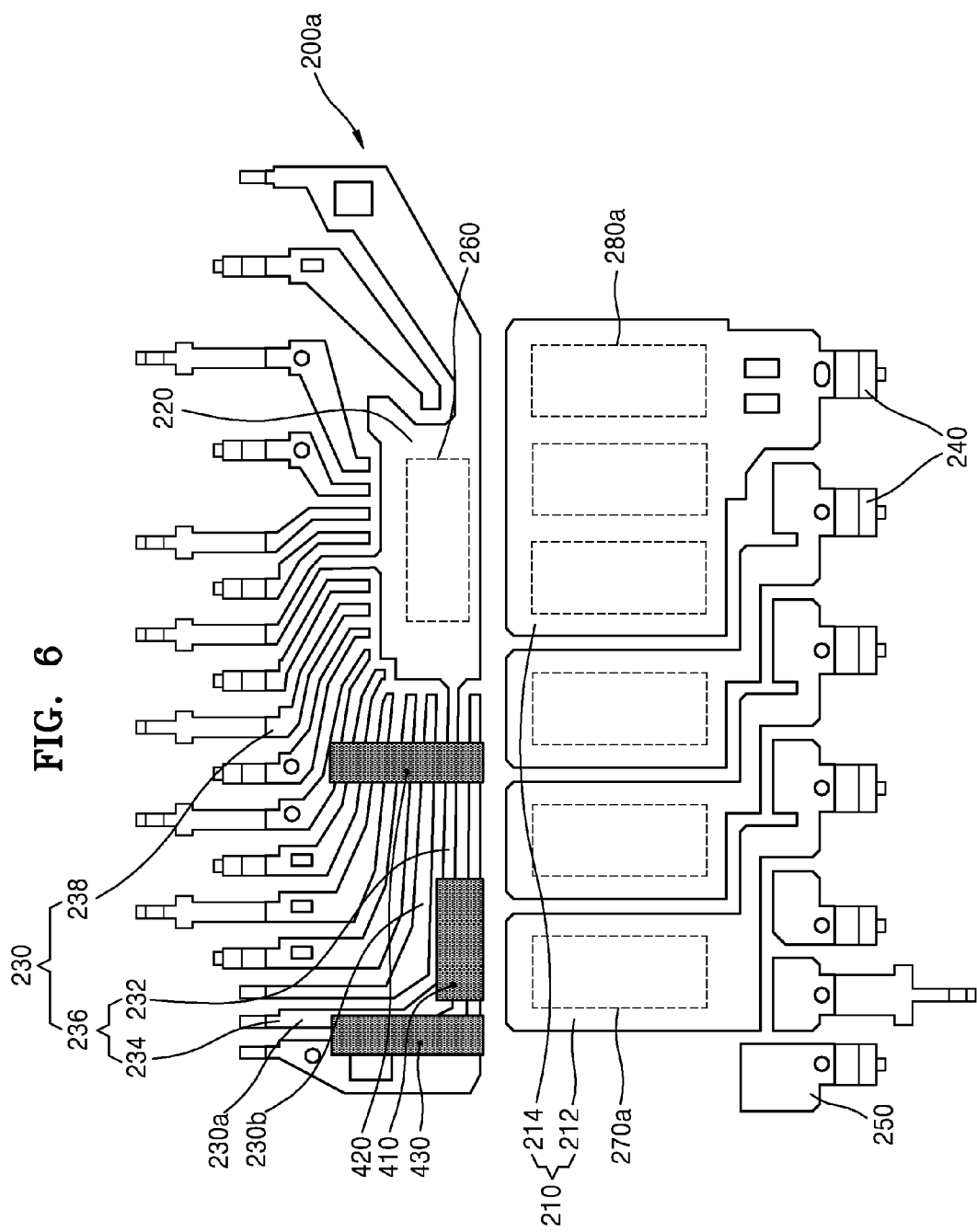
FIG. 6 is a plan view of a leadframe according to an embodiment of the present disclosure.

FIG. 6 is a plan view of a leadframe according to an embodiment of the present disclosure.

To be specific, FIG. 6 is a plan view of a leadframe 200*a* included in the semiconductor package 1000*a* illustrated in FIGS. 2 and 4.

Accordingly, those that are redundant in view of the description provided above with reference to FIGS. 2, 4 and 5 may not be repeatedly explained below.

Referring to FIG. 6, the leadframe 200*a* may include a transistor die attach pad 210 including a plurality of first die attach pads 212 and a single number of second die attach pad 214, and a single number of driver die attach pad 220.

A first device attach region 270*a*, to which one transistor device may be attached, may be arranged on each of the plurality of first die attach pads 212.

The single number of second die attach pad 214 may include a plurality of second device attach regions 280*a* to which one transistor device may be attached, respectively.

On the driver die attach pad 220, the driver attach region 260 may be arranged, to which the driver semiconductor chip may be attached.

The MOSFET device may be attached to the first and second device attach regions 270*a*, 280*a*.

The leadframe 200 may additionally include a driver lead 230, a first transistor lead 240 and a second transistor lead 250.

The plurality of driver leads 230 may include a first extension lead 236 including a first extension 232 extended along the first direction in which the plurality of first die attach pads 212 are aligned, and a second extension 234 extended in a direction different from the first direction, and a second extension lead 238 extended from around the driver die attach pad 220 to a direction different from the first direction.

The plurality of driver leads 230 may include a connecting lead 230*a* connected to the driver die attach pad 220, and a separation lead 230*b* separated from the driver die attach pad 220.

That is, the plurality of driver leads 230 may include the connection leads 230*a* and the rest (i.e., separation leads 230*b*).

An insulator 410 may be attached onto the first extension lead 236 to cover a portion of the first extension 232.

The insulator 410 may cover portion of the first extension 232 of one first extension lead 236, or cover portions of each of the first extensions 232 of two or more of first extension leads 236 together.

A first fixation 420 may be additionally attached onto the driver leads 230 to cover portions of the two or more driver leads 230 together.

A second fixation 430 to cover portions of the two or more driver leads 230 together may additionally be attached onto the driver lead 230.

Figure 7:
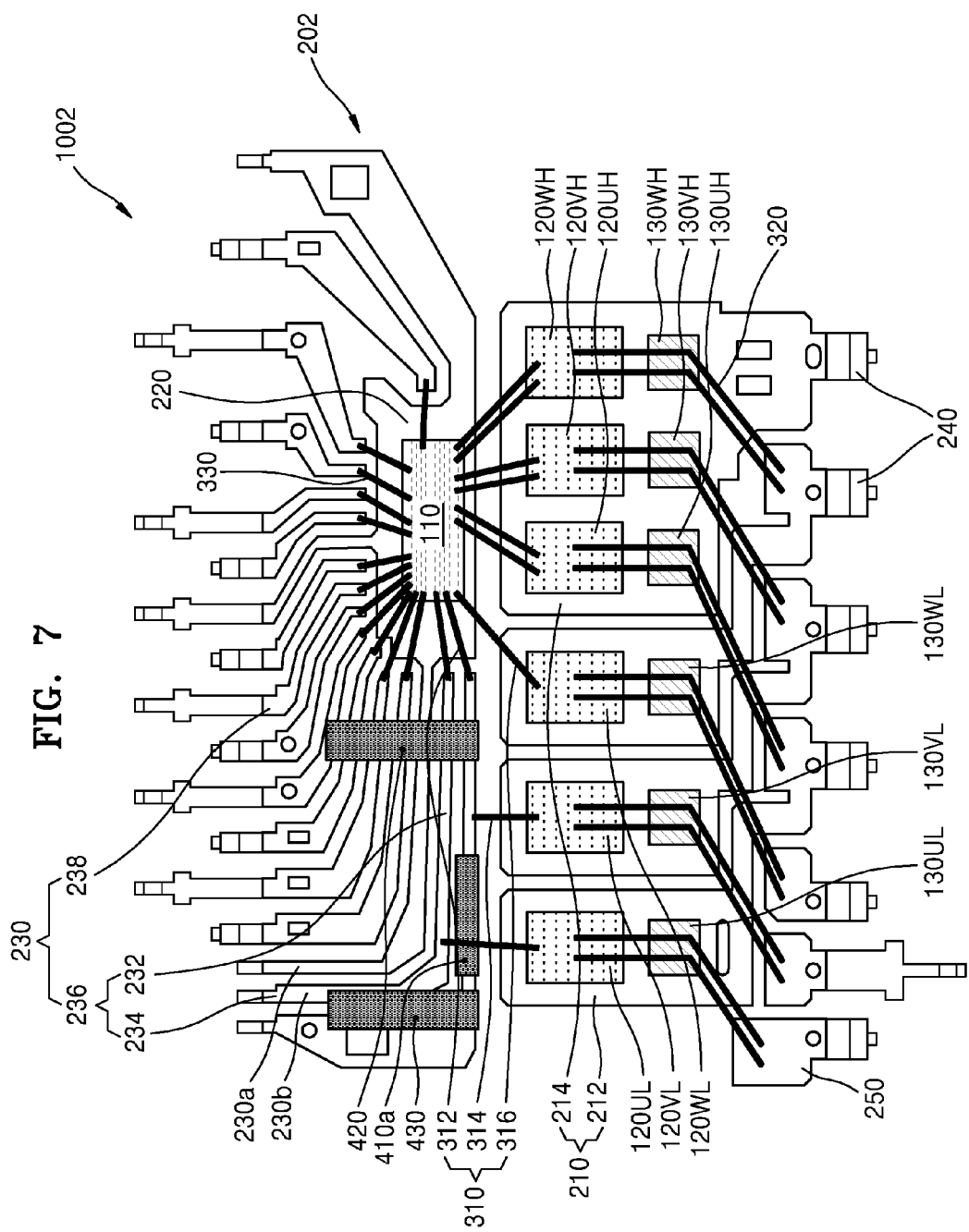
FIG. 7 is a plan view illustrating a main portion of a semiconductor package according to an embodiment of the present disclosure.

FIG. 7 is a plan view illustrating a main portion of a semiconductor package according to an embodiment of the present disclosure;

The schematic diagram of the semiconductor package illustrated in FIG. 7 is identical to that in FIG. 1.

Accordingly, in describing FIG. 7, those that are redundant in view of the description provided above with reference to FIGS. 1 and 2 may not be repeatedly explained below.

Referring to FIG. 7, the semiconductor package 1002 may include a leadframe 202, and a driver semiconductor chip 110, a plurality of transistor devices 120WH, 120WL, 120VH, 120VL, 120UH, 120UL and a plurality of diode devices 130WH, 130WL, 130VH, 130VL, 130UH, 130UL, attached to the leadframe 202.

The leadframe 202 may include a transistor die attach pad 210 including a plurality of first die attach pads 212 and a single number of second die attach pad 214, and a single number of driver die attach pad 220.

The leadframe 202 may additionally include a driver lead 230, a first transistor lead 240 and a second transistor lead 250.

The plurality of driver leads 230 may include a first extension lead 236 including a first extension 232 extended along the first direction in which the plurality of first die attach pads 212 are aligned, and a second extension 234 extended in a direction different from the first direction, and a second extension lead 238 extended from around the driver die attach pad 220 to a direction different from the first direction.

The plurality of driver leads 230 may include the connection leads 230a and the rest (i.e., separation leads 230b).

The semiconductor package 1002 may include an internal bonding wire 310, an output bonding wire 320 and an input bonding wire 330.

The internal bonding wire 310 may include a driver bonding wire 312, a transistor bonding wire 314 and a chip bonding wire 316.

In the semiconductor package 1000 illustrated in FIG. 2, among the plurality of driver leads 230 of the leadframe 200, the three first extension leads 236 are the separation lead 230b, the connection lead 230a and the separation lead 230b in the order of higher proximity to the plurality of first die attach pads 212. Differently from the above, in the semiconductor package 1002 illustrated in FIG. 7, the three first extension leads 236 of the plurality of driver leads 230 of the leadframe 202 are the separation lead 230b, the separation lead 230b and the connection lead 230a, respectively, in the order of higher proximity to the plurality of die attach pads 212.

In both the semiconductor package 1000 illustrated in FIG. 2 and the semiconductor package 1002 illustrated in FIG. 7, the driver bonding wires 312 and the transistor bonding wires 314 may be connected to two separation leads 230b which are in the proximity to the plurality of first die attach pads 212 of the plurality of driver leads 230.

Accordingly, in the semiconductor package 1000 illustrated in FIG. 2, the driver bonding wire 312 and the transistor bonding wire 314 are connected to the separation leads 230b which are the first and the third first extension leads 236 in the proximity to the plurality of first die attach pads 212 of the plurality of driver leads 230, while in the semiconductor package 1002 illustrated in FIG. 7, the driver bonding wire 312 and the transistor bonding wire 314 are connected to the separation leads 230b which are the first and second first extension leads 236 in the proximity to the plurality of first die attach pads 212 of the plurality of driver leads 230.

An insulator 410a may be attached onto the first extension lead 236 to cover a portion of the first extension 232.

The insulator 410a may cover a portion of the first extension 232 of the separation lead 230b which is the first of the first extension leads 236 in the proximity to the plurality of first die attach pads 212.

The transistor bonding wire 314 connected to the separation lead 230b (i.e., the second of the first extension lead 236) in the proximity to the plurality of first die attach pads 212 may connect the separation lead 230b and one transistor device 120UL through the insulator 410a phase.

Figure 8:
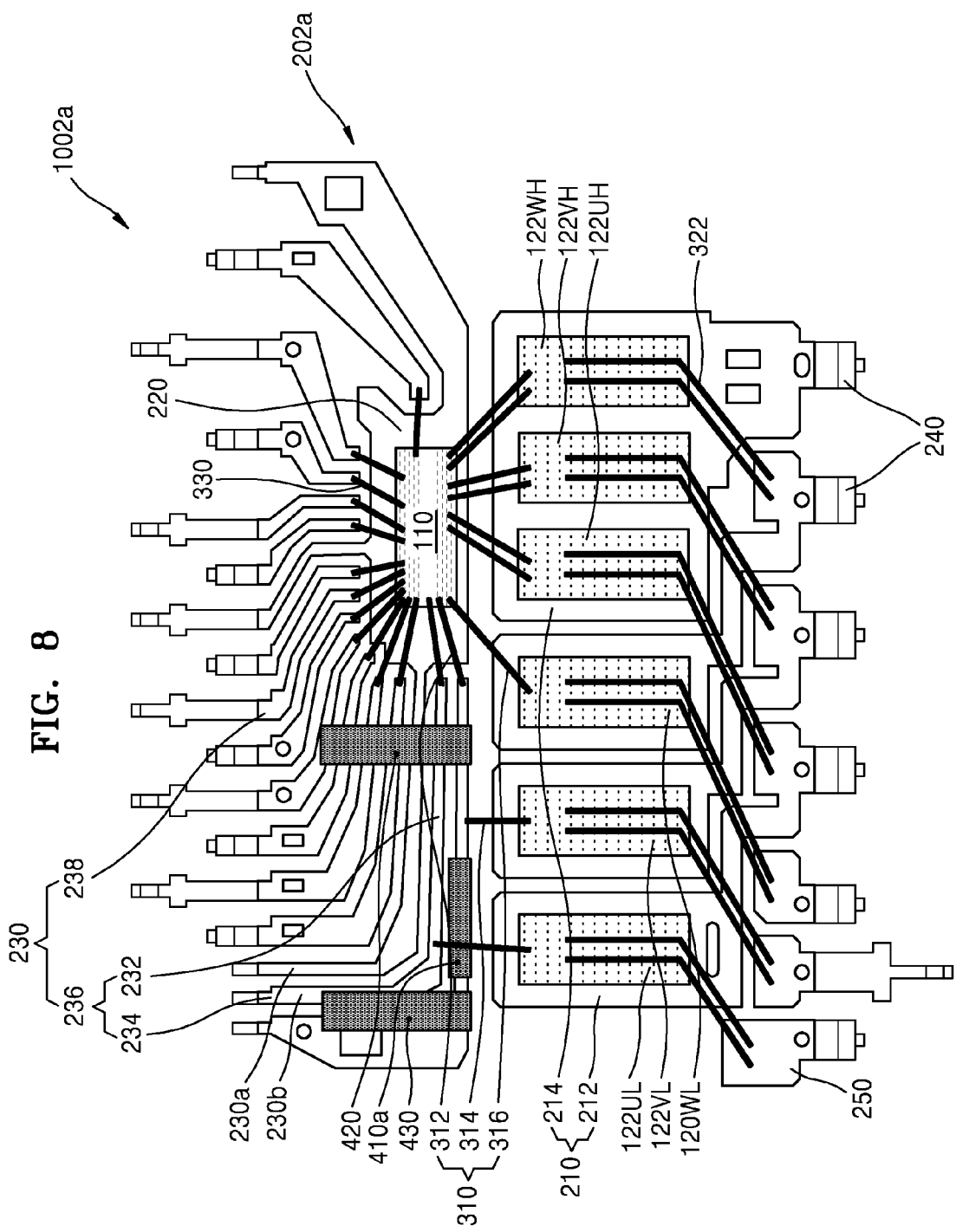
FIG. 8 is a plan view illustrating a main portion of a semiconductor package according to an embodiment of the present disclosure.

FIG. 8 is a plan view illustrating a main portion of a semiconductor package according to an embodiment of the present disclosure.

The schematic diagram of the semiconductor package illustrated in FIG. 8 is identical to that in FIG. 3.

Accordingly, in describing FIG. 8, those that are redundant in view of the description provided above with reference to FIGS. 3 and 4 may not be repeatedly explained below.

Referring to FIG. 8, the semiconductor package 1002a includes a leadframe 202a, and a driver semiconductor chip 110 and a plurality of transistor devices 122WH, 122WL, 122VH, 122VL, 122UH, 122UL, attached to the leadframe 202a.

The leadframe 202a may include a transistor die attach pad 210 including a plurality of first die attach pads 212 and a single number of second die attach pad 214, and a single number of driver die attach pad 220.

The leadframe 202a may additionally include a driver lead 230, a first transistor lead 240 and a second transistor lead 250.

The plurality of driver leads 230 may include a first extension lead 236 including a first extension 232 extended along the first direction in which the plurality of first die attach pads 212 are aligned, and a second extension 234 extended in a direction different from the first direction, and a second extension lead 238 extended from around the driver die attach pad 220 to a direction different from the first direction.

The plurality of driver leads 230 may include the connection leads 230a and the rest (i.e., separation leads 230b).

The semiconductor package 1002a may include an internal bonding wire 310, an output bonding wire 320 and an input bonding wire 330.

The internal bonding wire 310 may include a driver bonding wire 312, a transistor bonding wire 314 and a chip bonding wire 316.

In the semiconductor package 1000a illustrated in FIG. 4, among the plurality of driver leads 230 of the leadframe 200a, the three first extension leads 236 are the separation lead 230b, the connection lead 230a and the separation lead 230b respectively in the order of higher proximity to the plurality of first die attach pads 212. Differently from the above, in the semiconductor package 1002a illustrated in FIG. 8, the three first extension leads 236 of the plurality of driver leads 230 of the leadframe 202a are the separation lead 230b, the separation lead 230b and the connection lead 230a, respectively, in the order of higher proximity to the plurality of die attach pads 212.

In both the semiconductor package 1000a illustrated in FIG. 4 and the semiconductor package 1002a illustrated in FIG. 8, the driver bonding wires 312 and the transistor bonding wires 314 may be connected to two separation leads 230b which are in the proximity to the plurality of first die attach pads 212 of the plurality of driver leads 230.

Accordingly, in the semiconductor package 1000a illustrated in FIG. 4, the driver bonding wire 312 and the transistor bonding wire 314 are connected to the separation leads 230b which are the first and the third of the first extension leads 236 in the proximity to the plurality of first die attach pads 212 of the plurality of driver leads 230, while in the semiconductor package 1002a illustrated in FIG. 8, the driver bonding wire 312 and the transistor bonding wire 314 are connected to the separation leads 230b which are the first and second first extension leads 236 in the proximity to the plurality of first die attach pads 212 of the plurality of driver leads 230.

An insulator 410a may be attached onto the first extension lead 236 to cover a portion of the first extension 232.

The insulator 410a may cover a portion of the first extension 232 of the separation lead 230b which is the first of the first extension leads 236 in the proximity to the plurality of first die attach pads 212.

The transistor bonding wire 314 connected to the separation lead 230b (i.e., the second of the first extension lead 236) in the proximity to the plurality of first die attach pads 212 may connect the separation lead 230b and one transistor device 120UL through the insulator 410a phase.

Figure 9:
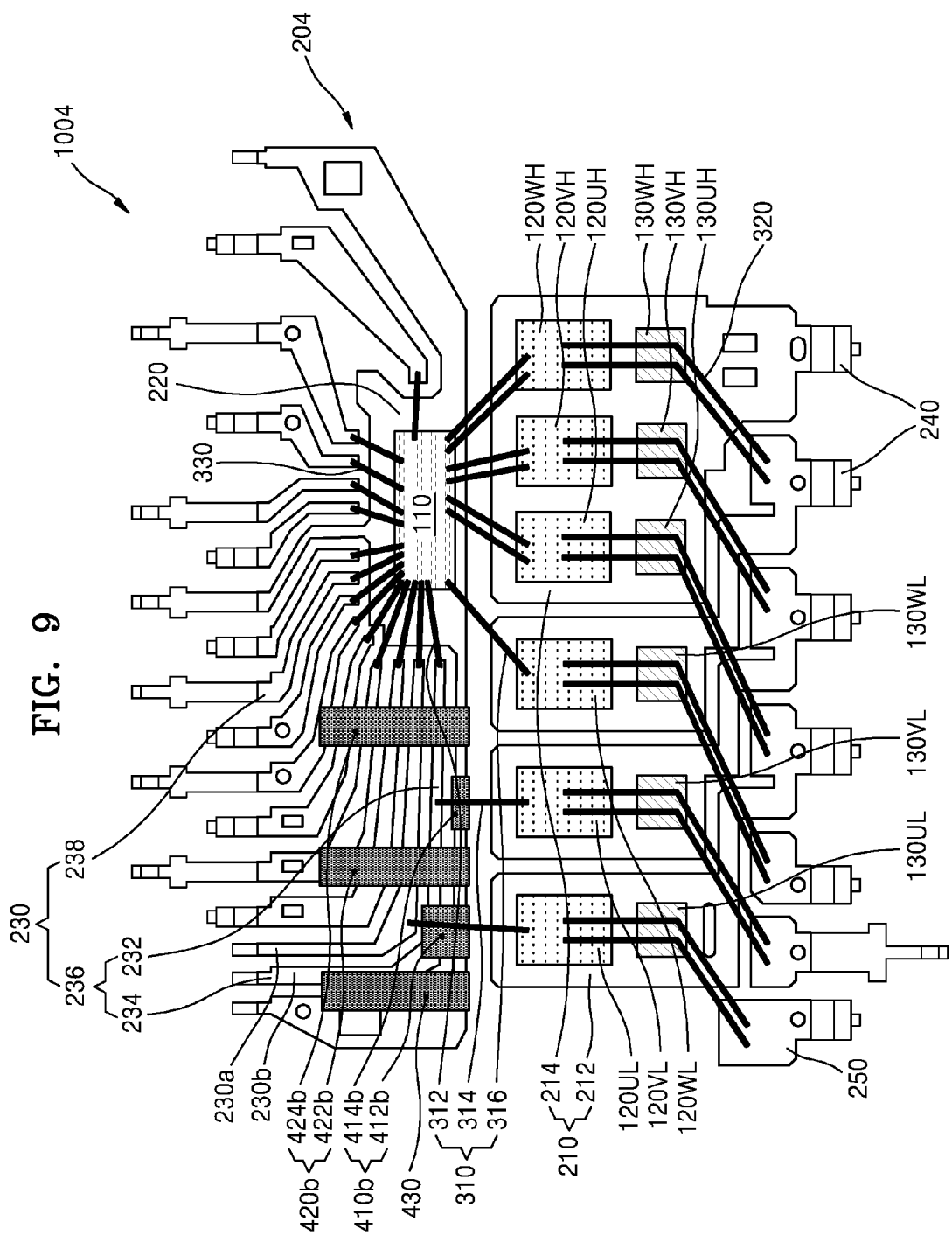
FIG. 9 is a plan view illustrating a main portion of a semiconductor package according to an embodiment of the present disclosure.

FIG. 9 is a plan view illustrating a main portion of a semiconductor package according to an embodiment of the present disclosure.

The schematic diagram of the semiconductor package illustrated in FIG. 9 is identical to that in FIG. 1.

Accordingly, in describing FIG. 9, those that are redundant in view of the description provided above with reference to FIGS. 1 and 2 may not be repeatedly explained below.

Referring to FIG. 9, the semiconductor package 1004 may include a leadframe 204, and a driver semiconductor chip 110, a plurality of transistor devices 120WH, 120WL, 120VH, 120VL, 120UH, 120UL and a plurality of diode devices 130WH, 130WL, 130VH, 130VL, 130UH, 130UL, attached to the leadframe 204.

The leadframe 204 may include a transistor die attach pad 210 including a plurality of first die attach pads 212 and a single number of second die attach pad 214, and a single number of driver die attach pad 220.

The leadframe 204 may additionally include a driver lead 230, a first transistor lead 240 and a second transistor lead 250.

The plurality of driver leads 230 may include a first extension lead 236 including a first extension 232 extended along the first direction in which the plurality of first die attach pads 212 are aligned, and a second extension 234 extended in a direction different from the first direction, and a second extension lead 238 extended from around the driver die attach pad 220 to a direction different from the first direction.

The plurality of driver leads 230 may include the connection leads 230a and the rest (i.e., separation leads 230b).

The semiconductor package 1004 may include an internal bonding wire 310, an output bonding wire 320 and an input bonding wire 330.

The internal bonding wire 310 may include a driver bonding wire 312, a transistor bonding wire 314 and a chip bonding wire 316.

In the semiconductor package 1000 illustrated in FIG. 2, among the plurality of driver leads 230 of the leadframe 200, the three first extension leads 236 are the separation lead 230b, the connection lead 230a and the separation lead 230b respectively in the order of higher proximity to the plurality of first die attach pads 212. Differently from the above, in the semiconductor package 1004 illustrated in FIG. 9, the three first extension leads 236 of the plurality of driver leads 230 of the leadframe 202 are the connection lead 230a, the separation lead 230b, and the separation lead 230b, respectively, in the order of higher proximity to the plurality of die attach pads 212.

In both the semiconductor package 1000 illustrated in FIG. 2 and the semiconductor package 1004 illustrated in FIG. 9, the driver bonding wires 312 and the transistor bonding wires 314 may be connected to two separation leads 230b which are in the proximity to the plurality of first die attach pads 212 of the plurality of driver leads 230.

Accordingly, in the semiconductor package 1000 illustrated in FIG. 2, the driver bonding wire 312 and the transistor bonding wire 314 are connected to the separation leads 230b which are the first and the third of the first extension leads 236 in the proximity to the plurality of first die attach pads 212 of the plurality of driver leads 230, while in the semiconductor package 1004 illustrated in FIG. 9, the driver bonding wire 312 and the transistor bonding wire 314 are connected to the separation leads 230b which are the second and third of the first extension leads 236 in the proximity to the plurality of first die attach pads 212 of the plurality of driver leads 230.

Two insulators 410b may be attached onto the first extension lead 236 to cover a portion of the first extension 232.

The two insulators 410b may cover a portion of the first extension 232 of the first of the first extension leads 236 in the proximity to the plurality of first die attach pads 212, and cover a portion of the first extension 232 of each of the first and second of the first extension leads 236, respectively.

The two transistor bonding wires 314 connected to the separation leads 230b which are the second and the third of the first extension leads 236 in the proximity to the plurality of first die attach pads 212 may connect the separation leads 230b and one transistor device 120UL through one insulator phase (412b or 414b) of each of the two insulators 410b.

A first fixation 420b may be additionally attached onto the driver leads 230 to cover portions of the first extension 232 of each of the two or more first extension leads 236 together.

There may be two 422b, 424b of the first fixation 420b, which may be attached to cover the other portions of the first extension 232 of each of the two or more first extension leads 236 together.

Figure 10:
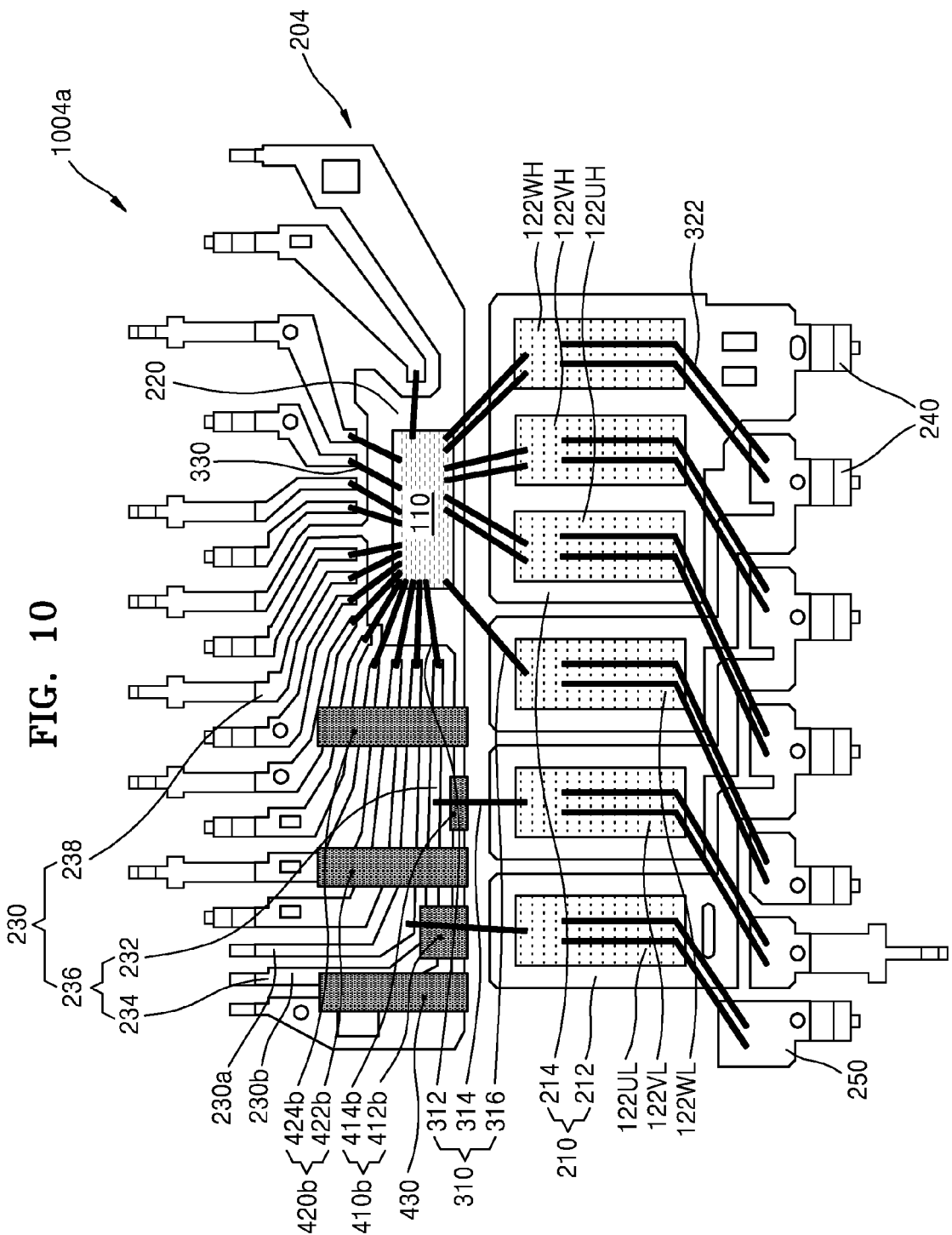
FIG. 10 is a plan view illustrating a main portion of a semiconductor package according to an embodiment of the present disclosure.

FIG. 10 is a plan view illustrating a main portion of a semiconductor package according to an embodiment of the present disclosure.

The schematic diagram of the semiconductor package illustrated in FIG. 10 is identical to that in FIG. 3.

Accordingly, in describing FIG. 10, those that are redundant in view of the description provided above with reference to FIGS. 3 and 4 may not be repeatedly explained below.

Referring to FIG. 10, the semiconductor package 1004a includes a leadframe 204a, and a driver semiconductor chip 110 and a plurality of transistor devices 122WH, 122WL, 122VH, 122VL, 122UH, 122UL, attached to the leadframe 204a.

The leadframe 204a may include a transistor die attach pad 210 including a plurality of first die attach pads 212 and a single number of second die attach pad 214, and a single number of driver die attach pad 220.

The leadframe 204a may additionally include a driver lead 230, a first transistor lead 240 and a second transistor lead 250.

The plurality of driver leads 230 may include a first extension lead 236 including a first extension 232 extended along the first direction in which the plurality of first die attach pads 212 are aligned, and a second extension 234 extended in a direction different from the first direction, and a second extension lead 238 extended from around the driver die attach pad 220 to a direction different from the first direction.

The plurality of driver leads 230 may include the connection leads 230a and the rest (i.e., separation leads 230b).

The semiconductor package 1004a may include an internal bonding wire 310, an output bonding wire 320 and an input bonding wire 330.

The internal bonding wire 310 may include a driver bonding wire 312, a transistor bonding wire 314 and a chip bonding wire 316.

In the semiconductor package 1000a illustrated in FIG. 4, among the plurality of driver leads 230 of the leadframe 200a, the three first extension leads 236 are the separation lead 230b, the connection lead 230a and the separation lead 230b respectively in the order of higher proximity to the plurality of first die attach pads 212. Differently from the above, in the semiconductor package 1004a illustrated in FIG. 10, the three first extension leads 236 of the plurality of driver leads 230 of the leadframe 204a are the connection lead 230a, the separation lead 230b, and the separation lead 230b respectively, in the order of higher proximity to the plurality of die attach pads 212.

In both the semiconductor package 1000a illustrated in FIG. 4 and the semiconductor package 1004a illustrated in FIG. 10, the driver bonding wires 312 and the transistor bonding wires 314 may be connected to two separation leads 230b which are in the proximity to the plurality of first die attach pads 212 of the plurality of driver leads 230.

Accordingly, in the semiconductor package 1000a illustrated in FIG. 4, the driver bonding wire 312 and the transistor bonding wire 314 are connected to the separation leads 230b which are the first and the third of the first extension leads 236 in the proximity to the plurality of first die attach pads 212 of the plurality of driver leads 230, while in the semiconductor package 1004a illustrated in FIG. 10, the driver bonding wire 312 and the transistor bonding wire 314 are connected to the separation leads 230b which are the second and the third of the first extension leads 236 in the proximity to the plurality of first die attach pads 212 of the plurality of driver leads 230.

Two insulators 410b may be attached onto the first extension lead 236 to cover a portion of the first extension 232.

The two insulators 410b may cover a portion of the first extension 232 of the first of the first extension leads 236 in the proximity to the plurality of first die attach pads 212, and cover a portion of the first extension 232 of each of the first and second of the first extension leads 236.

The two transistor bonding wires 314 connected to the separation leads 230b which are the second and the third of the first extension leads 236 in the proximity to the plurality of first die attach pads 212 may connect the separation leads 230b and one transistor device 120UL through one insulator phase (412b or 414b) of each of the two insulators 410b.

A first fixation 420b may be additionally attached onto the driver leads 230 to cover portions of the first extension 232 of each of the two or more driver leads 232 together.

There may be two 422b, 424b of the first fixation 420b, which may be attached to cover the other portions of the first extension 232 of each of the two or more first extension leads 236 together.

In the semiconductor packages 1000, 1002, 1004 illustrated in FIGS. 2, 7 and 9, and in the semiconductor packages 1000a, 1002a, 1004a illustrated in FIGS. 4, 8 and 10, three first extension leads 236 in the proximity to the plurality of first die attach pads 212 are illustrated as one connection lead 230a and two separation leads 230b. However, embodiments are not limited to this example only. Accordingly, all the three first extension leads 236 that are in the proximity to the plurality of first die attach pads 212 may be the separation leads 230b, or alternatively, two of the three first extension leads 236 may be the connection leads 230a.

When two of the three first extension leads 236 in the proximity to the first die attach pads 212 are the connection leads 230a, the fourth of the first extension leads 236 in the proximity to the plurality of first die attach pads 212 may be the separation lead 230b.

For example, in an exemplary arrangement, the separation leads 230b may be arranged in the proximity to the plurality of first die attach pads 212, in a number corresponding to the number of transistor devices to connect to the driver semiconductor chip 110 via the driver bonding wire 312 and the transistor bonding wire 314, and depending on needs, it is possible that the connection leads 230a may not be arranged, or arranged in the closest proximity to the plurality of first die attach pads 212, or arranged between two separation leads 230b.

Figure 11:
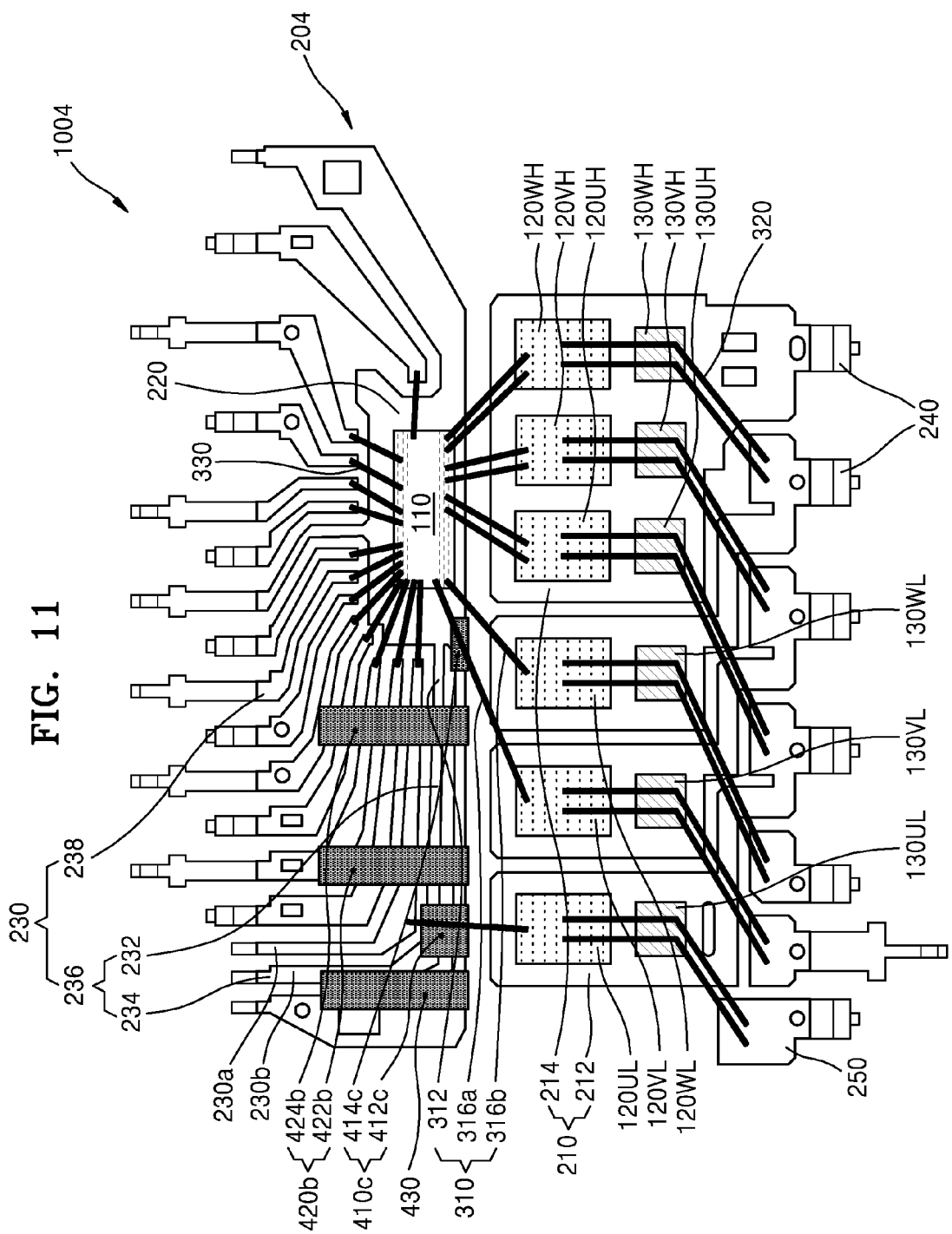
FIG. 11 is a plan view illustrating a main portion of a semiconductor package according to an embodiment of the present disclosure.
Figure 12:
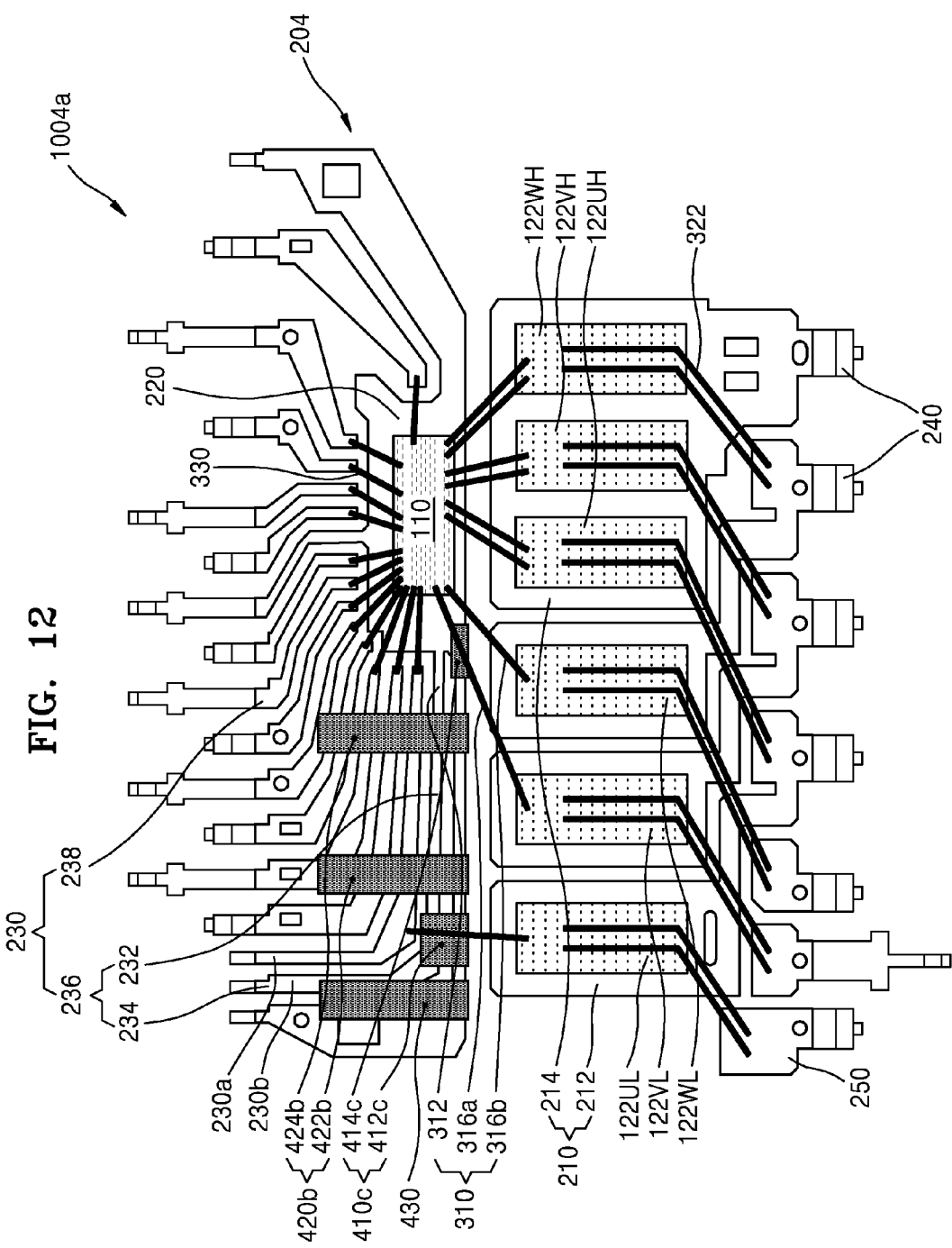
FIG. 12 is a plan view illustrating a main portion of a semiconductor package according to an embodiment of the present disclosure.

FIGS. 11 and 12 are plan views illustrating a main portion of a semiconductor package according to an embodiment of the present disclosure.

The schematic diagrams of the semiconductor package illustrated in FIGS. 11 and 12 are identical to those illustrated in FIGS. 1 and 3.

Accordingly, in describing FIGS. 11 and 12, those that are redundant in view of the description provided above with reference to FIGS. 1 to 4 may not be repeatedly explained below.

Referring to FIGS. 11 and 12, among the plurality of transistor devices 120WH, 120WL, 120VH, 120VL, 120UH, 120UL, the transistor devices that have an overlap between the straight lines for electric connection to the driver semiconductor chip 110 and a portion of the driver lead 230 may be electrically connected to the driver semiconductor chip 110 by the first chip bonding wire 316a.

For example, the V-phase lower arm transistor devices 120VL, 122VL may have the straight lines for electric connection with the driver semiconductor chip 110 overlapping with a portion of the driver lead 230, and the first chip bonding wire 316a may connect the V-phase lower arm transistor devices 120VL, 122VL to the driver semiconductor tor 110.

On a portion of the driver lead 230 overlapped with the first chip bonding wire 316a, an insulator 414c may be arranged to insulate between the first chip bonding wire 316a and the driver lead 230 overlapped therewith.

As the first chip bonding wire 316a is overlapped with a portion of the driver lead 230, the overlapped driver lead 230 is insulated by the insulator 414c. However, the second chip bonding wire 316b, which is not overlapped with the driver lead 230, does not need an insulator for the insulation purpose.

Figure 13:
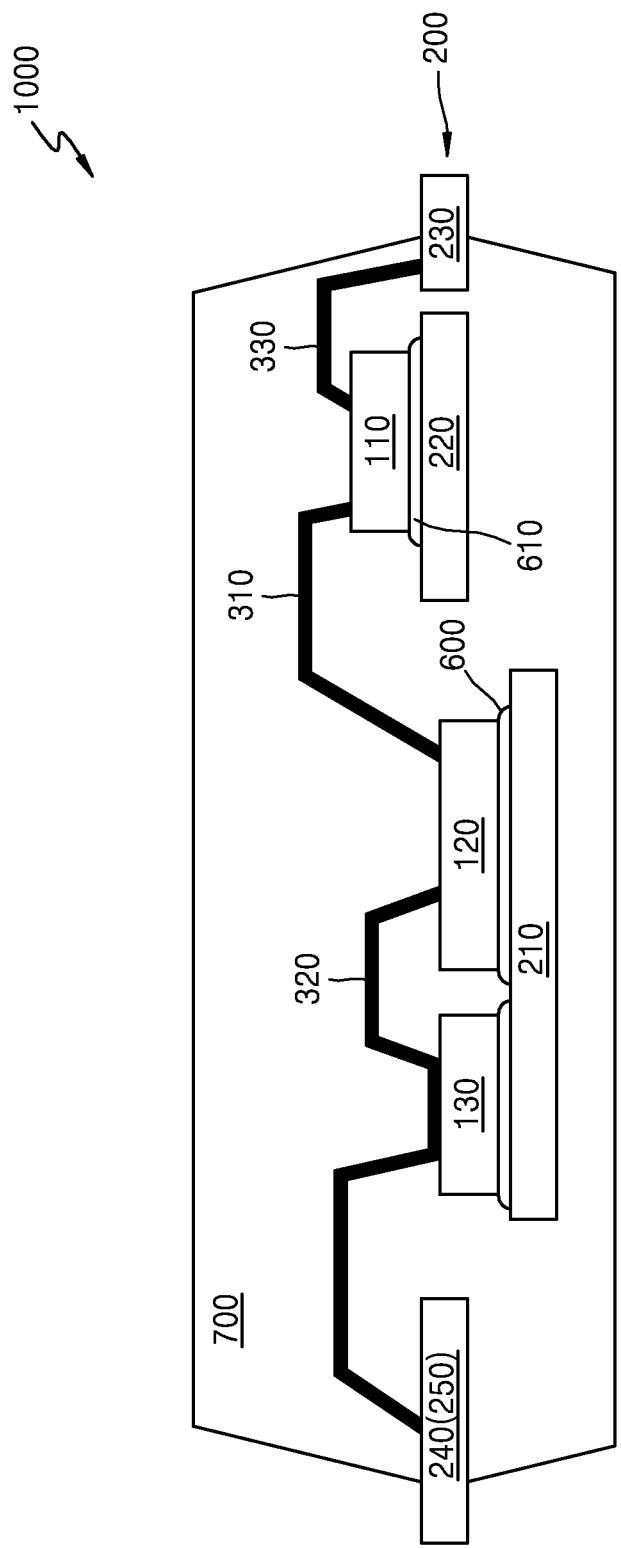
FIG. 13 is a cross-section view illustrating a main portion of a semiconductor package according to an embodiment of the present disclosure.

FIG. 13 is a cross-section view illustrating a main portion of a semiconductor package according to an embodiment of the present disclosure.

To be specific, FIG. 13 is a cross-section view of a main portion of the semiconductor package 1000 illustrated in FIGS. 1 and 2, and the redundant explanation for the overlapping parts with FIGS. 1 and 2 may be omitted for the sake of brevity.

Referring to FIG. 13, the semiconductor package 1000 includes a leadframe 200, and a driver semiconductor chip 110, a transistor device 120, and a diode device 130, attached to the leadframe 200.

The leadframe 200 may include a transistor die attach pad 210, a driver die attach pad 220, a driver lead 230, a first transistor lead 240 and a second transistor lead 250.

On the transistor die attach pad 210, the transistor device 120 and the diode device 130 may be attached.

The transistor device 120 and the diode device 130 may be attached onto the transistor die attach pad 210 using a first adhesive layer 600, respectively.

The first adhesive layer 600 may include a conductive material.

For example, the first adhesive layer 600 may be a conductive paste or a conductive adhesive film.

On the driver die attach pad 220, the driver semiconductor chip 110 may be attached.

The driver semiconductor chip 110 may be attached onto the driver die attach pad 220 using a second adhesive layer 610.

The second adhesive layer 610 may include an insulating material.

For example, the second adhesive layer 610 may be an epoxy resin or an insulating adhesive film.

The driver semiconductor chip 110 may be electrically connected to the transistor device 120 via the internal bonding wire 310.

The transistor device 120 and the diode device 130 may be electrically connected via the output bonding wire 320, and may be electrically connected to the first transistor lead 240 or the second transistor lead 250.

The driver semiconductor chip 110 may be electrically connected to the driver lead 230 via the internal bonding wire 330.

The molding member 700 may surround a portion of the leadframe 200, the driver semiconductor chip 110, the transistor device 120, the diode device 130 and the inner bonding wire 310, the output bonding wire 320 and the input bonding wire 330.

The molding member may include epoxy molding compound (EMC), for example.

A portion of the leadframe 200, i.e., portions of the driver lead 230, the first transistor lead 240 and the second transistor lead 250 may be exposed outside by the molding member 700, and thus used as the inputs and outputs of the semiconductor package 1000.

As illustrated in FIG. 13, the internal bonding wire 310 may be exemplified in the form of the chip bonding wire 316 illustrated in FIG. 2, but not limited thereto. Accordingly, it is also possible that a driver bonding wire 312 and a transistor bonding wire 314 is applied, which electrically connects the driver semiconductor chip 110 and the transistor device 120 through the separation lead 230b, as illustrated in FIG. 2.

Further, the semiconductor package 1000 illustrated in FIG. 13 may correspond to the semiconductor packages 1002, 1004 illustrated in FIGS. 7 and 9.

Figure 14:
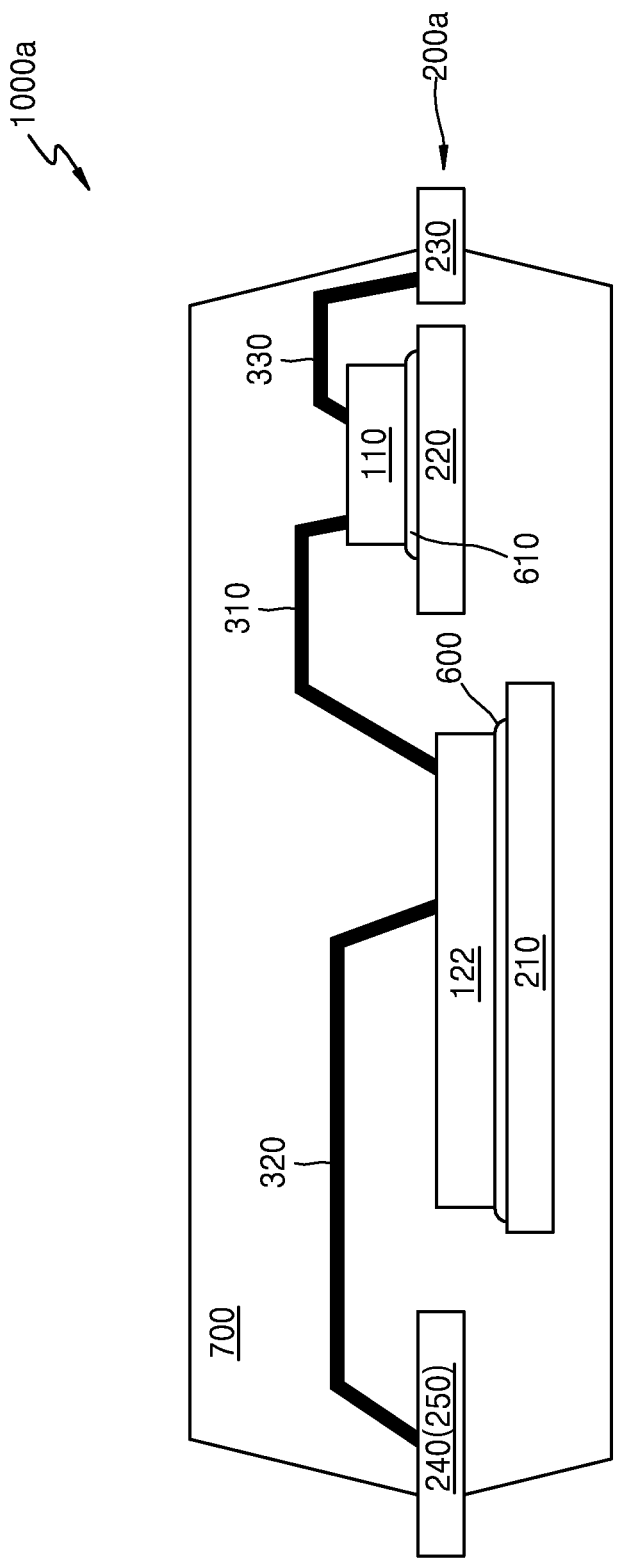
FIG. 14 is a cross-section view illustrating a main portion of a semiconductor package according to an embodiment of the present disclosure.

FIG. 14 is a cross-section view illustrating a main portion of a semiconductor package according to an embodiment of the present disclosure.

To be specific, FIG. 14 is a cross-section view of a main portion of the semiconductor package 1000a illustrated in FIGS. 3 and 4, and the redundant explanation for the overlapping parts with FIGS. 3 and 4 may be omitted for the sake of brevity.

Referring to FIG. 14, the semiconductor package 1000a includes a leadframe 200a, and a driver semiconductor chip 110 and a transistor device 122 attached to the leadframe 200a.

The leadframe 200a may include a transistor die attach pad 210, a driver die attach pad 220, a driver lead 230, a first transistor lead 240 and a second transistor lead 250.

On the transistor die attach pad 210, the transistor device 122 may be attached.

The transistor device 122 may be attached onto the transistor die attach pad 210 using a first adhesive layer 600.

The first adhesive layer 600 may include a conductive material.

For example, the first adhesive layer 600 may be a conductive paste or a conductive adhesive film.

On the driver die attach pad 220, the driver semiconductor chip 110 may be attached.

The driver semiconductor chip 110 may be attached onto the driver die attach pad 220 using a second adhesive layer 610.

The second adhesive layer 610 may include an insulating material.

For example, the second adhesive layer 610 may be an epoxy resin or an insulating adhesive film.

The driver semiconductor chip 110 may be electrically connected to the transistor device 122 via the internal bonding wire 310.

The transistor device 122 may be electrically connected via the output bonding wire 320 to the first transistor lead 240 or the second transistor lead 250.

The driver semiconductor chip 110 may be electrically connected to the driver lead 230 via the internal bonding wire 330.

The molding member 700 may surround a portion of the leadframe 200a, the driver semiconductor chip 110, the transistor device 122, and the inner bonding wire 310, the output bonding wire 320 and the input bonding wire 330.

A portion of the leadframe 200a, i.e., portions of the driver lead 230, the first transistor lead 240 and the second transistor lead 250 may be exposed outside by the molding member 700, and thus used as the inputs and outputs of the semiconductor package 1000a.

As illustrated in FIG. 14, the internal bonding wire 310 may be exemplified in the form of the chip bonding wire 316 illustrated in FIG. 4, but not limited thereto. Accordingly, it is also possible that a driver bonding wire 312 and a transistor bonding wire 314 is applied, which electrically connects the driver semiconductor chip 110 and the transistor device 122 through the separation lead 230b, as illustrated in FIG. 4.

Further, the semiconductor package 1000a illustrated in FIG. 14 may correspond to the semiconductor packages 1002a, 1004a illustrated in FIGS. 8 and 10.

Figure 15:
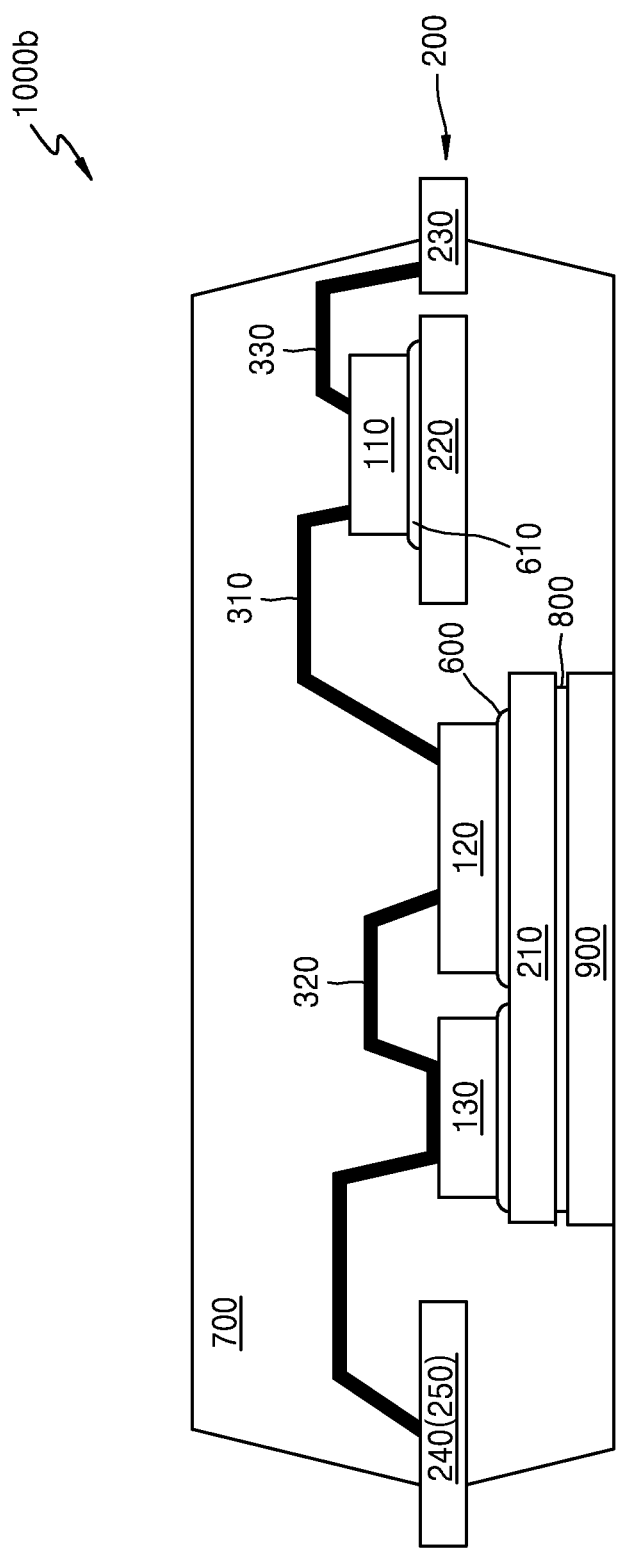
FIG. 15 is a cross-section view illustrating a main portion of a semiconductor package according to an embodiment of the present disclosure.

FIG. 15 is a cross-section view illustrating a main portion of a semiconductor package according to an embodiment of the present disclosure.

In describing FIG. 15, those that are redundant with the description provided above with reference to FIG. 13 may not be repeatedly explained.

Referring to FIG. 15, the semiconductor package 1000b includes a leadframe 200, and a driver semiconductor chip 110, a transistor device 120, and a diode device 130 attached to the leadframe 200.

The leadframe 200 may include a transistor die attach pad 210, a driver die attach pad 220, a driver lead 230, a first transistor lead 240 and a second transistor lead 250.

On a lower portion of the transistor die attach pad 210, a thermally conductive substrate 900 may be attached.

The thermally conductive substrate 900 may be attached to the lower portion of the transistor die attach pad 210 using a third adhesive layer 800.

The thermally conductive substrate 900 may be, for example, a direct bonded copper (DBC) substrate, a thick of thin film copper (TFC) substrate, a direct fired copper (DFC) substrate, or a ceramic substrate.

The third adhesive layer 800 may include an epoxy resin, a solder paste or a B-stage adhesive material.

The thermally conductive substrate 900 may be attached across all the lower surfaces of the plurality of first die attach pads 212 and the single number of second die attach pad 214 constituting the transistor die attach pad 210 illustrated in FIG. 2.

The lower surface of the thermally conductive substrate 900 may be exposed by the molding member 700.

A heatsink (not illustrated) may be attached to the lower surface through which the thermally conductive substrate 900 is exposed.

Further, the semiconductor package 1000b illustrated in FIG. 15 may correspond to the semiconductor packages 1002, 1004 illustrated in FIGS. 7 and 9.

Figure 16:
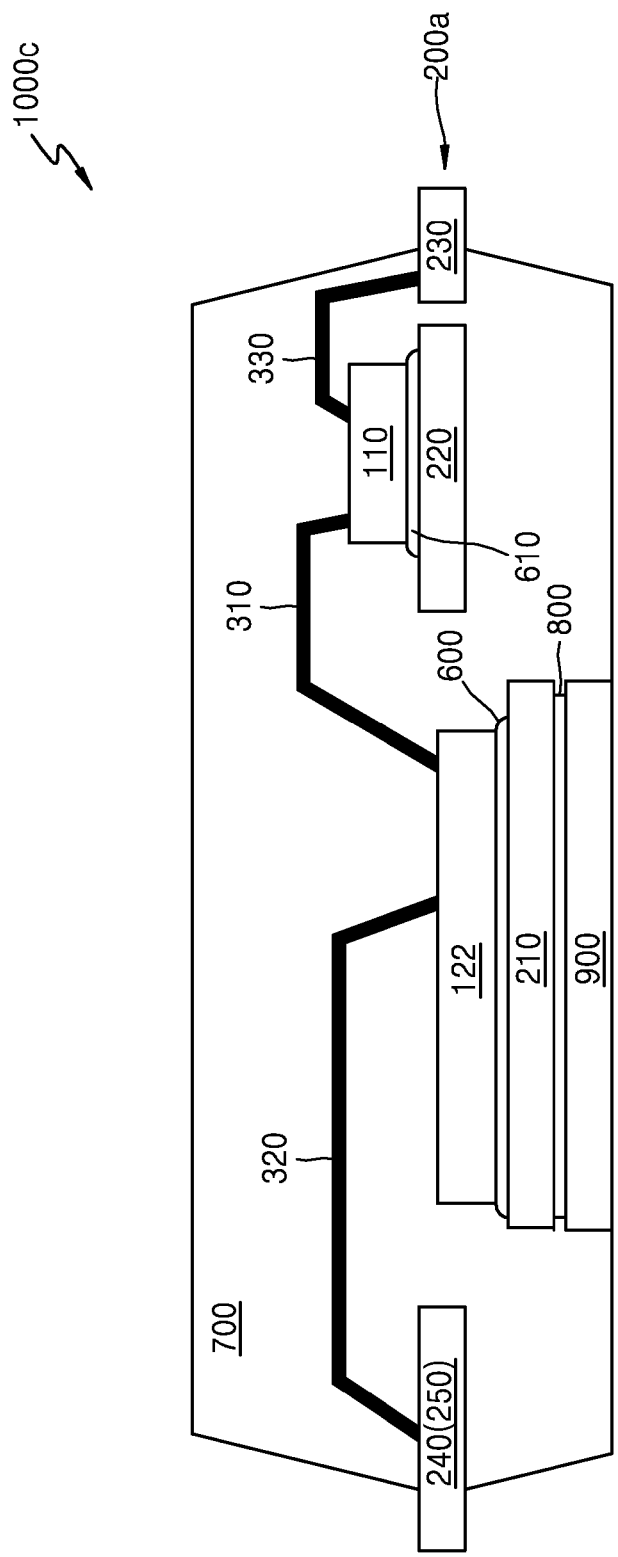
FIG. 16 is a cross-section view illustrating a main portion of a semiconductor package according to an embodiment of the present disclosure.

FIG. 16 is a cross-section view illustrating a main portion of a semiconductor package according to an embodiment of the present disclosure.

In describing FIG. 16, those that are redundant with the description provided above with reference to FIG. 15 may not be repeatedly explained.

Referring to FIG. 16, the semiconductor package 1000c includes a leadframe 200a, and a driver semiconductor chip 110, a transistor device 122, and a diode device 130, attached to the leadframe 200a.

The leadframe 200a may include a transistor die attach pad 210, a driver die attach pad 220, a driver lead 230, a first transistor lead 240 and a second transistor lead 250.

On a lower portion of the transistor die attach pad 210, a thermally conductive substrate 900 may be attached.

The thermally conductive substrate 900 may be attached to the lower portion of the transistor die attach pad 210 using a third adhesive layer 800.

The thermally conductive substrate 900 may be attached across all the lower surfaces of the plurality of first die attach pads 212 and the single number of second die attach pad 214 constituting the transistor die attach pad 210 illustrated in FIG. 4.

The lower surface of the thermally conductive substrate 900 may be exposed by the molding member 700.

A heatsink (not illustrated) may be attached to the lower surface through which the thermally conductive substrate 900 is exposed.

Further, the semiconductor package 1000c illustrated in FIG. 16 may correspond to the semiconductor packages 1002a, 1004a illustrated in FIGS. 8 and 10.

Figure 17:
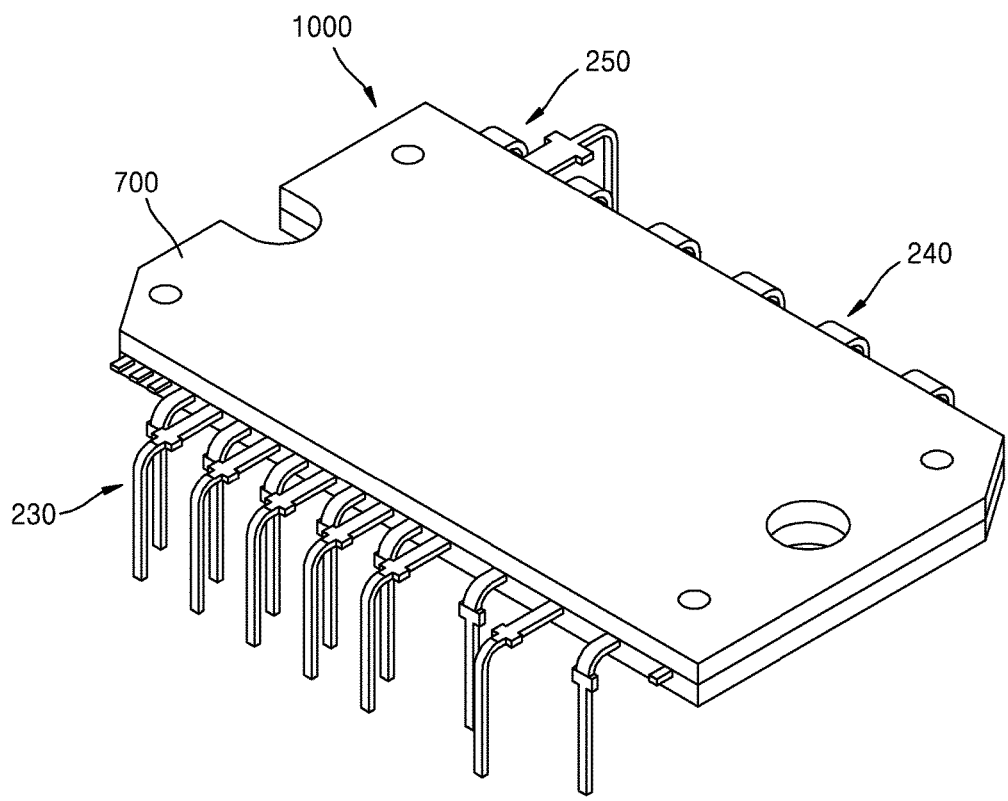
FIG. 17 is a perspective view of a semiconductor package according to an embodiment of the present disclosure.

FIG. 17 is a perspective view of a semiconductor package according to an embodiment of the present disclosure.

To be specific, FIG. 17 is a perspective view of the semiconductor package illustrated in FIG. 13.

Accordingly, those that are redundant in view of the description provided above with reference to FIG. 13 may not be repeatedly explained below.

Referring to FIG. 17, the semiconductor package 1000 is surrounded by the molding member 700, with portions of the first to second transistor leads 230, 240, 250 being exposed outside the molding member 700.

For example, the first to second transistor leads 230, 240, 250 may be processed so that the semiconductor package 1000 is implemented as a dual in-line package (DIP).

Some of the driver leads 230 may be dummy leads which have shorter length of extension to outside the molding member 700 compared to the rest of driver leads 230.

The driver leads 230 used as the dummy leads may not be exposed outside the molding member 700, in contrast to the illustration in the drawing.

Further, the semiconductor package 1000 illustrated in FIG. 17 may correspond to the semiconductor packages 1000a, 1002, 1002a, 1004, 1004a illustrated in FIGS. 4 and 7 to 10.

Figure 18:
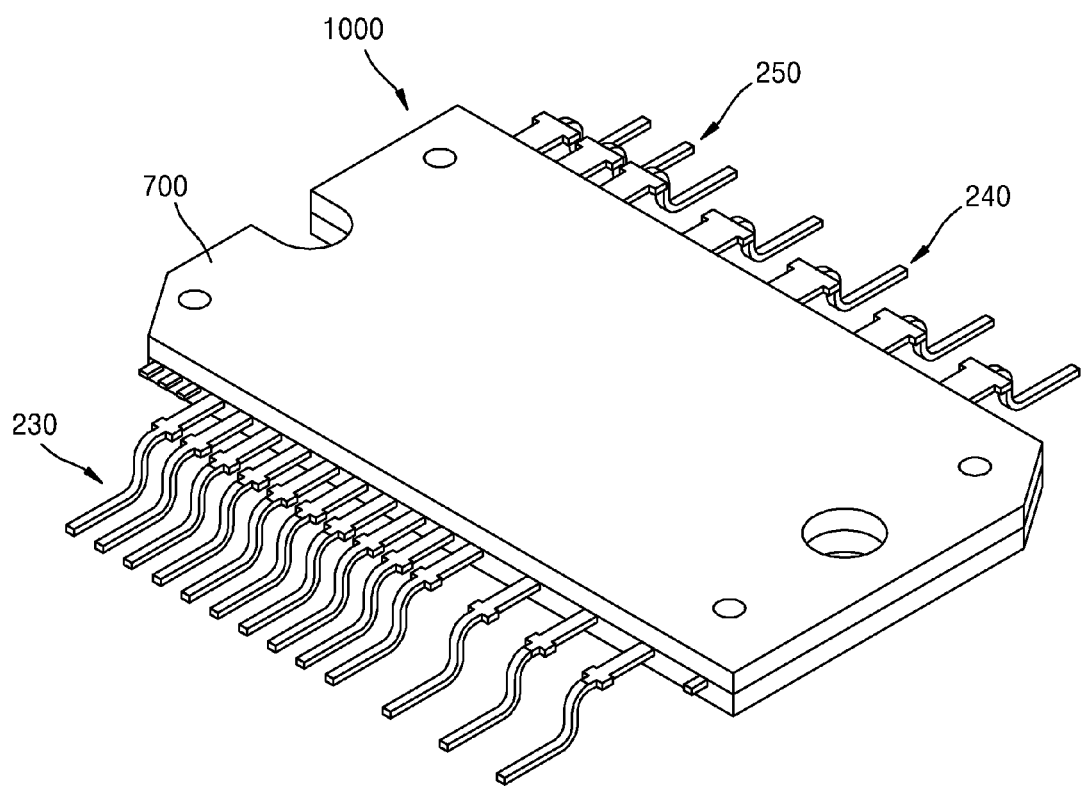
FIG. 18 is a perspective view of a semiconductor package according to an embodiment of the present disclosure.

FIG. 18 is a perspective view of a semiconductor package according to an embodiment of the present disclosure.

To be specific, FIG. 18 is a perspective view of the semiconductor package illustrated in FIG. 13.

Accordingly, those that are redundant in view of the description provided above with reference to FIG. 13 may not be repeatedly explained below.

Referring to FIG. 18, the semiconductor package 1000 is surrounded by the molding member 700, with portions of the first to second transistor leads 230, 240, 250 being exposed outside the molding member 700.

For example, the first to second transistor leads 230, 240, 250 may be processed so that the semiconductor package 1000 is implemented as a surface mount device (SMD).

Some of the driver leads 230 may be dummy leads which have shorter length of extension to outside the molding member 700 compared to the rest of driver leads 230.

The driver leads 230 used as the dummy leads may not be exposed outside the molding member 700, in contrast to the illustration in the drawing.

Further, the semiconductor package 1000 illustrated in FIG. 18 may correspond to the semiconductor packages 1000a, 1002, 1002a, 1004, 1004a illustrated in FIGS. 4 and 7 to 10.

Figure 19:
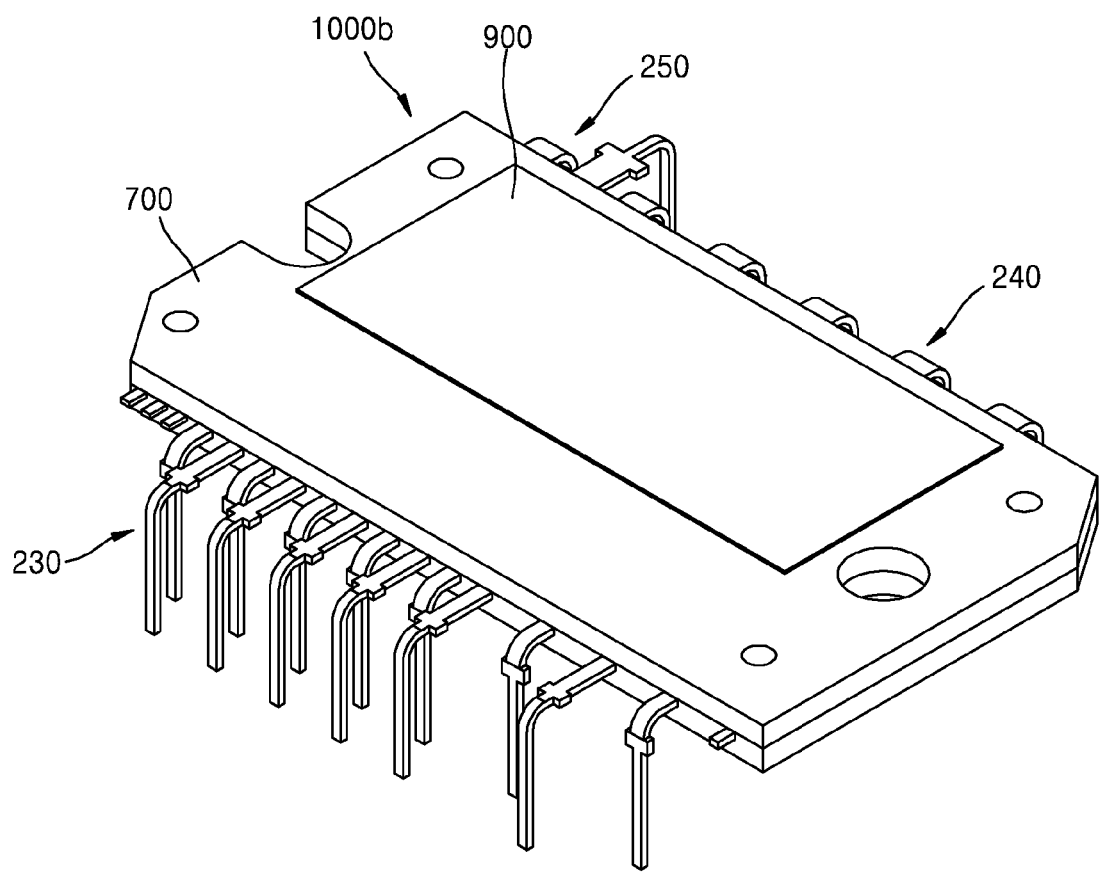
FIG. 19 is a perspective view of a semiconductor package according to an embodiment of the present disclosure.

FIG. 19 is a perspective view of a semiconductor package according to an embodiment of the present disclosure.

To be specific, FIG. 19 is a perspective view of the semiconductor package illustrated in FIG. 15.

Accordingly, those that are redundant in view of the description provided above with reference to FIG. 15 may not be repeatedly explained below.

Referring to FIG. 19, the semiconductor package 1000b is surrounded by the molding member 700, with portions of the first to second transistor leads 230, 240, 250 being exposed outside the molding member 700.

For example, the first to second transistor leads 230, 240, 250 may be processed so that the semiconductor package 1000 is implemented as a dual in-line package (DIP).

Further, a thermally conductive substrate 900 may be exposed by the molding member 700.

A heatsink (not illustrated) may be attached onto the thermally conductive substrate 900.

Some of the driver leads 230 may be dummy leads which have shorter length of extension to outside the molding member 700 compared to the rest of driver leads 230.

The driver leads 230 used as the dummy leads may not be exposed outside the molding member 700, in contrast to the illustration in the drawing.

Further, the semiconductor package 1000 illustrated in FIG. 19 may correspond to the semiconductor packages 1000, 1000a, 1002, 1002a, 1004, 1004a illustrated in FIGS. 2, 4 and 7 to 10.

Figure 20:
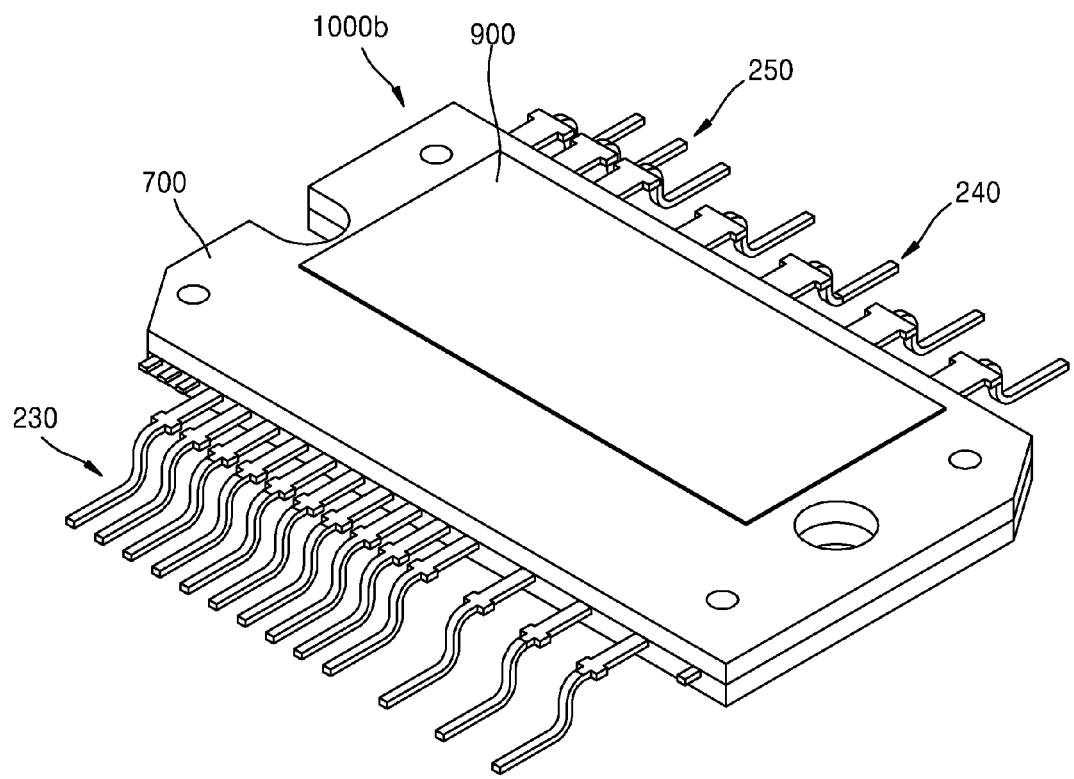
FIG. 20 is a perspective view of a semiconductor package according to an embodiment of the present disclosure.

FIG. 20 is a perspective view of a semiconductor package according to an embodiment of the present disclosure.

To be specific, FIG. 20 is a perspective view of the semiconductor package illustrated in FIG. 15.

Accordingly, those that are redundant in view of the description provided above with reference to FIG. 15 may not be repeatedly explained below.

Referring to FIG. 20, the semiconductor package 1000b is surrounded by the molding member 700, with portions of the first to second transistor leads 230, 240, 250 being exposed outside the molding member 700.

For example, the first to second transistor leads 230, 240, 250 may be processed so that the semiconductor package 1000b is implemented as a surface mount device (SMD).

Further, a thermally conductive substrate 900 may be exposed by the molding member 700.

A heatsink (not illustrated) may be attached onto the thermally conductive substrate 900.

Some of the driver leads 230 may be dummy leads which have shorter length of extension to outside the molding member 700 compared to the rest of driver leads 230.

The driver leads 230 used as the dummy leads may not be exposed outside the molding member 700, in contrast to the illustration in the drawing.

Further, the semiconductor package 1000 illustrated in FIG. 20 may correspond to the semiconductor packages 1000, 1000a, 1002, 1002a, 1004, 1004a illustrated in FIGS. 2, 4 and 7 to 10.

Although a few embodiments of the present invention have been shown and described, it would be appreciated by those skilled in the art that changes may be made in these embodiments without departing from the principles and spirit of the invention, the scope of which is defined in the claims and their equivalents.

DESCRIPTION OF SYMBOLS 1000, 1000a, 1000b, 1000c, 1002, 1002a, 1004, 1004a: semiconductor package, 110, driver semiconductor chip, 120, 120WH, 120WL, 120VH, 120VL, 120UH, 120UL, 122, 122WH, 122WL, 122VH, 122VL, 122UH, 122UL: transistor devices, 124WH, 124WL, 124VH, 124VL, 124UH, 124UL: body diodes, 130, 130WH, 130WL, 130VH, 130VL, 130UH, 130UL: diode devices, 200, 200a: leadframe, 210: transistor die attach pad, 212: first die attach pads, 214: second die attach pad, 220: driver die attach pad, 230: driver lead, 230a: connection lead, 230b: separation lead, 232: first extension, 234: second extension, 236: first extension lead, 238: second extension lead, 240: first transistor lead, 250: second transistor lead, 310: internal bonding wire, 312: driver bonding wire, 314: transistor bonding wire, 316: chip bonding wire, 320: output bonding wire, 330: input bonding wire, 410, 410a, 410b, 412b, 414b, 414c: insulators, 420, 420b, 422b, 424b: first fixations, 430: second fixation, 600: first adhesive layer, 610: second adhesive layer, 700: molding member, 800: third adhesive layer, 900: thermally conductive substrate.

What is claimed is:

1. A semiconductor package, comprising:
    a first transistor device and a second transistor device located on at least one or more transistor die attach pads of a leadframe;
    a driver semiconductor chip located on a driver die attach pad of the leadframe;
    a first driver lead of the leadframe electrically connected to the driver semiconductor chip;
    a second driver lead of the leadframe located between the first driver lead and the at least one or more transistor die attach pads;
    a chip bond wire electrically connecting the first transistor device to the driver semiconductor chip;
    a first transistor bond wire electrically connecting the first driver lead to the second transistor device; and
    a first insulator arranged on the second driver lead to insulate the second driver lead from the first transistor bonding wire.

2. The semiconductor package of claim 1, wherein the leadframe further comprises a third driver lead arranged between the first driver lead and the at least one or more transistor die attach pads and connected to the driver die attach pad, wherein the third driver lead is insulated from the first transistor bond wire by the first insulator.

3. The semiconductor package of claim 2, wherein the third driver lead is arranged between the second driver lead and the at least one or more transistor die attach pads.

4. The semiconductor package of claim 2, wherein the third driver lead is arranged between the first driver lead and the second driver lead.

5. The semiconductor package of claim 1, wherein the second driver lead is electrically connected to the driver semiconductor chip, and the semiconductor package further comprises:
    a third transistor device arranged on the at least one or more transistor die attach pads; and
    a second transistor bond wire electrically connecting the second driver lead with the third transistor device.

6. The semiconductor package of claim 5, wherein the leadframe further comprises a third driver lead arranged between the second driver lead and the at least one or more transistor die attach pads and connected to the driver die attach pad, and
    wherein the semiconductor package further comprises a second insulator arranged on the third driver lead to insulate the third driver lead from the second transistor bonding wire.

7. The semiconductor package of claim 6, wherein the electrical connection between the third transistor device and the driver semiconductor chip is overlapped by at least a portion of the third driver lead, and
    wherein the second transistor bond wire electrically connects the third transistor device with the driver semiconductor chip through the second driver lead.

8. The semiconductor package of claim 7, wherein the first transistor device, the second transistor device, and the third transistor device are arranged with an overall length along a first direction, and
    wherein the driver semiconductor chip is oriented in a second direction that is substantially perpendicular to the first direction, and wherein a center point of the driver semiconductor chip is offset by a first length in the direction of the first transistor device from a center point of the overall length.

9. The semiconductor package of claim 1, wherein the chip bond wire connects the first transistor device with the driver semiconductor chip such that the chip bond wire of the first transistor device with the driver semiconductor chip is not overlapped by the second driver lead.

10. The semiconductor package of claim 1, wherein the chip bond wire between the first transistor device and the driver semiconductor chip is overlapped by at least a portion of the second driver lead, and
wherein the semiconductor package further comprises a third insulator arranged on the second driver lead to insulate the second driver lead from the chip bond wire.

11. The semiconductor package of claim 1, wherein the first transistor bond wire between the second transistor device and the driver semiconductor chip is overlapped by at least a portion of the second driver lead, and
wherein the first transistor bond wire electrically connects the second transistor device with the driver semiconductor chip through the first driver lead.

12. The semiconductor package of claim 10, wherein the first transistor device and the second transistor device are arranged along a first direction with an overall length, and
wherein the driver semiconductor chip is oriented in a second direction that is substantially perpendicular to the first direction, and wherein a center point of the driver semiconductor chip is offset by a first length in the direction of the first transistor device from a center point of the overall length.

13. The semiconductor package of claim 1, wherein each of the first and second transistor devices comprise an IGBT device or a MOSFET device.

14. The semiconductor package of claim 1, wherein the driver semiconductor chip performs an inter-lock function.

15. The semiconductor package of claim 1, wherein the first driver lead and the second driver lead are arranged at a predetermined interval based on the arrangement of the first driver lead and the second driver lead.

16. The semiconductor package of claim 1, wherein third, fourth, fifth, and sixth transistor devices are further arranged on the at least one or more transistor die attach pads and wherein the at least one or more transistor die attach pads comprise:
at least one or more first die attach pads on which at least one or more transistor devices of the first to sixth transistor devices are arranged; or
at least one or more second die attach pads where a plurality of transistor devices of the first to sixth transistor devices are arranged together.

17. The semiconductor package of claim 1, wherein the second driver lead is electrically connected to the driver die attach pad, or wherein the second driver lead is separated from the driver die attach pad but electrically connected to the driver semiconductor chip via the driver semiconductor chip and a driver bond wire.

18. A semiconductor package, comprising:
a leadframe comprising at least one or more transistor die attach pads on which a first transistor device and a second transistor device are oriented along a first direction and have an overall length, a driver die attach pad oriented in a second direction substantially perpendicular to the first direction, the driver die attach pad having a driver semiconductor chip arranged thereon, a first driver lead electrically connected to the driver semiconductor chip, and a second driver lead arranged between the first driver lead and the at least one or more transistor die attach pads;
a chip bond wire electrically connecting the first transistor device with the driver semiconductor chip; and
a first transistor bond wire electrically connecting the first driver lead with the second transistor device, wherein a substantially straight line of a second transistor bond wire between the second transistor device and the driver semiconductor chip is overlapped by at least a portion of the second driver lead,
wherein the driver semiconductor chip is oriented in a second direction that is substantially perpendicular to the first direction, and wherein a center point of the driver semiconductor chip is offset by a first length in the direction of the first transistor device from a center point of the overall length,
wherein the second driver lead is electrically connected to the driver semiconductor chip, and the leadframe further comprises a third driver lead arranged between the second driver lead and the at least one or more transistor die attach pads, and connected to the driver die attach pad, and
wherein the semiconductor package further comprises a third transistor device arranged on the at least one or more transistor die attach pads, wherein a substantially straight line of a third transistor bond wire between the third transistor device and the driver semiconductor chip is overlapped by at least a portion of the third driver lead; and
the second transistor bond wire electrically connecting the second driver lead with the third transistor device.

19. The semiconductor package of claim 18, wherein the leadframe further comprises a third driver lead arranged between the first driver lead and the at least one or more transistor die attach pads, and connected to the driver die attach pad, and
wherein the semiconductor package further comprises a first insulator arranged on the third driver lead to insulate the third driver lead from the first transistor bond wire.

20. The semiconductor package of claim 18, further comprising a second insulator arranged on the second driver lead to insulate the second driver lead from the first transistor bonding wire.

21. A semiconductor package comprising:
a leadframe comprising at least one or more transistor die attach pads on which at least one or more first transistor devices, at least one or more second transistor devices, and at least one or more third transistor devices are oriented in a first direction with an overall length, a driver die attach pad oriented in a second direction substantially perpendicular to the first direction, the driver die attach pad having a driver semiconductor chip arranged thereon, a first driver lead electrically connected to the driver semiconductor chip, a second driver lead arranged between the first driver lead and the at least one or more transistor die attach pads and electrically connected to the driver semiconductor chip, and a third driver lead arranged between the second driver lead and the at least one or more transistor die attach pads and connected to the driver die attach pad;
a chip bond wire electrically connecting the first transistor device with the driver semiconductor chip;
a first transistor bond wire electrically connecting the second driver lead with the second transistor device, wherein the first transistor bond wire between the second transistor device and the driver semiconductor chip is overlapped by at least a portion of the third driver lead; and
a second transistor bond wire electrically connecting the first driver lead with the third transistor device, wherein the second transistor bond wire between the third transistor device and the driver semiconductor chip is overlapped by at least a portion of the second driver lead, wherein the driver semiconductor chip is oriented in a second direction that is substantially perpendicular to the first direction, and wherein a center point of the driver semiconductor chip is offset by a first length in the direction of the first transistor device from a center point of the overall length.

* * * * *